United States Patent
Zong et al.

(10) Patent No.: US 12,180,582 B2
(45) Date of Patent: Dec. 31, 2024

(54) COATING METHOD AND FILM LAYER THEREOF, AND COATING FIXTURE AND APPLICATION THEREOF

(71) Applicant: JIANGSU FAVORED NANOTECHNOLOGY CO., LTD., Wuxi (CN)

(72) Inventors: Jian Zong, Wuxi (CN); Ji Peng, Wuxi (CN); Yingjing Dai, Wuxi (CN); Wei Shan, Wuxi (CN); Zhuyao Lan, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 301 days.

(21) Appl. No.: 17/770,599

(22) PCT Filed: Oct. 21, 2020

(86) PCT No.: PCT/CN2020/122476
§ 371 (c)(1),
(2) Date: Apr. 20, 2022

(87) PCT Pub. No.: WO2021/078151
PCT Pub. Date: Apr. 29, 2021

(65) Prior Publication Data
US 2022/0290295 A1 Sep. 15, 2022

(30) Foreign Application Priority Data

Oct. 21, 2019 (CN) .......................... 201910997625.2
Oct. 21, 2019 (CN) .......................... 201910997632.2

(51) Int. Cl.
*C23C 16/04* (2006.01)
*C23C 16/458* (2006.01)
(Continued)

(52) U.S. Cl.
CPC ............ *C23C 16/04* (2013.01); *C23C 16/458* (2013.01); *C23C 16/52* (2013.01); *C23C 16/56* (2013.01)

(58) Field of Classification Search
CPC ...... H05K 3/284; C23C 16/56; C23C 16/042; C23C 14/042; C23C 16/52; C23C 16/458; (Continued)

(56) References Cited

U.S. PATENT DOCUMENTS

| | | |
|---|---|---|
| 3,895,135 A | 7/1975 | Hofer |
| 4,448,797 A | 5/1984 | Burnham |

(Continued)

FOREIGN PATENT DOCUMENTS

| | | |
|---|---|---|
| CN | 201317806 | 9/2009 |
| CN | 103668054 | 5/2014 |

(Continued)

OTHER PUBLICATIONS

Extended European Search Report issued in European Patent Application No. 20879229.1, dated Mar. 15, 2024.

(Continued)

*Primary Examiner* — Yuechuan Yu
(74) *Attorney, Agent, or Firm* — Parker Highlander PLLC

(57) ABSTRACT

Provided in the present disclosure are a coating method and a film layer thereof, and a coating chucking appliance and an application thereof. The coating method comprises the steps of: forming a normal film layer on a first component on a substrate surface, and forming at least a thinner film layer on a second component on the substrate surface, wherein the thickness of the normal film layer is greater than the thickness of the thinner film layer. The coating method can prepare a thinner film layer on the surface of some portions or parts on the substrate surface, and prepare a thicker film layer on the surface of other portions or parts, thereby (Continued)

satisfying the requirements of coating a thinner film layer on some electronic components of the substrate, such as circuit interface components, ensuring data transmission performance.

31 Claims, 10 Drawing Sheets

(51) Int. Cl.
    *C23C 16/52*     (2006.01)
    *C23C 16/56*     (2006.01)

(58) Field of Classification Search
    CPC ..... C23C 14/50; C23C 16/04; C23C 16/4585; C23C 14/044
    See application file for complete search history.

(56) References Cited

U.S. PATENT DOCUMENTS

| | | |
|---|---|---|
| 2003/0173208 A1 | 9/2003 | Pam et al. |
| 2004/0191201 A1 | 9/2004 | Maio et al. |
| 2004/0232109 A1 | 11/2004 | Yoshinaga |
| 2005/0183946 A1 | 8/2005 | Pan et al. |
| 2010/0307415 A1* | 12/2010 | Shero ................ C23C 16/45504 137/561 A |
| 2011/0085316 A1 | 4/2011 | Myers et al. |
| 2015/0321214 A1 | 11/2015 | Cox et al. |
| 2016/0246010 A1 | 8/2016 | Medhat et al. |
| 2020/0335641 A1 | 10/2020 | Duoeyrat et al. |
| 2021/0359256 A1 | 11/2021 | Du |

FOREIGN PATENT DOCUMENTS

| | | |
|---|---|---|
| CN | 104213073 | 12/2014 |
| CN | 107250033 | 10/2017 |
| CN | 108490510 | 9/2018 |
| CN | 208266255 | 12/2018 |
| CN | 109136874 | 1/2019 |
| CN | 109280897 | 1/2019 |
| CN | 208373471 | 1/2019 |
| CN | 109609902 | 4/2019 |
| CN | 109769398 | 5/2019 |
| CN | 110344016 | 10/2019 |
| CN | 110699662 | 1/2020 |
| CN | 110699671 | 1/2020 |
| JP | 08335558 A * | 12/1996 |
| JP | 2004156098 A | 6/2004 |
| JP | 2005314802 | 11/2005 |
| JP | 2007191753 | 8/2007 |
| JP | 2009003348 | 1/2009 |
| JP | 2011195876 | 10/2011 |
| JP | 2013104091 | 5/2013 |
| WO | 2019/175372 | 9/2019 |

OTHER PUBLICATIONS

English translation of International Search Report issued in International Patent Application No. PCT/CN2020/122476, dated Sep. 16, 2020.

Partial European Search Report issued in European Patent Application No. 20879229.1, dated Oct. 10, 2024.

* cited by examiner

COATING METHOD AND FILM LAYER
THEREOF, AND COATING FIXTURE AND
APPLICATION THEREOF

This application is a national phase application under 35 U.S.C. § 371 of International Application No. PCT/CN2020/122476, filed Oct. 21, 2020, which claims the benefit of priority to Chinese Patent Application No. 201910997625.2, filed Oct. 21, 2019, Chinese patent application No. 201910997632.2, filed Oct. 21, 2019.

TECHNICAL FIELD

The present disclosure relates to the field of coating, and more particularly to a coating method, a coating layer, and a coating chucking appliance and an application of the coating chucking appliance.

BACKGROUND

With the development of electronic products, performance of the electronic products, such as shatter resistance, scratch resistance, wear resistance, heat dissipation, water resistance and corrosion resistance, are important factors to obtain advantages in the fierce market competition. Surface modification of the electronic products, especially formation of a thin protective coating on a product surface by a chemical vapor deposition process, is an important means to improve above properties. For example, coating a waterproof film layer or a waterproof nano film layer on a surface of the electronic product through a vacuum coating process can effectively improve waterproof performances and underwater power-on performances of the electronic products. In recent years, this technology has been gradually popularized and applied to waterproof watches, waterproof mobile phones and other electronic products. When the waterproof electronic products with above coating treatment is immersed in water, the waterproof film layer or the waterproof nano film layer can effectively prevent a circuit or an external interface of the electronic products, such as a USB port and charging port, from being short due to water, and can prevent water from corroding a circuit board or electronic components of the waterproof electronic products.

However, when some electronic components on the circuit board, such as a circuit interface component like an adapter and a USB socket, are coated with a thick waterproof film, important functions of the circuit interface component, such as data transmission and electronic signal emission, are greatly reduced due to an insulating polymer material of the film layer, resulting in OTG (On-The-Go) test failure. Therefore, an upper thickness limit of the film layer on the surface of these devices is more stringent. Generally, a thickness of the waterproof film layer on the surface of the adapter and the USB socket on a circuit board is less than a thickness of the film layer on other parts of a main board surface of the circuit board.

At present, in order to achieve different thicknesses of film layers in different areas, shielding pretreatment such as pasting paper or coating resin glue or peelable glue on the circuit interface component or other special areas is performed firstly, and the coating process is performed twice, including: 1) after shielding the adapter, performing a first coating, and the thickness of the coated film layer is relatively large, so as to meet requirements of key protection devices on the main board; 2) removing the shielding and performing a second coating to meet conductivity requirements of the circuit interface component. The process of shielding and removing the shielding is often carried out manually, which leads to a rise of labor cost and prolonging of coating time, resulting in a significant rise in economic cost of coating process and a decrease in productivity.

In recent years, rapid development of coating technology, especially vapor deposition technology, makes the use of surface coating technology to improve the performance of the electronic products become a technology hotspot. The surface coating technology can impart properties to electronic products, such as good shatter resistance, excellent scratch resistance, good heat dissipation, water resistance, underwater power-on performance, and corrosion resistance. A plasma chemical vapor deposition technique is a commonly used coating technique at present. Plasma is generated under the action of an electric field, and gaseous substance containing constituent atoms of the film layer chemically reacts by means of the plasma to deposit a protective film layer on a surface of a product.

However, for a substrate having a plurality of electronic components on the surface, such as an antenna elastic strip, a sensor, a camera module, an acoustic device and a USB interface, when performing the coating, it is necessary to selectively coat according to characteristics of different electronic devices. For example, electronic components requiring low impedance cannot be completely coated, or cannot be coated with a thick film. Since the film-forming raw material in the chemical vapor deposition process is in a gaseous state, and the gaseous coating material deposits the film layer on a surface of all electronic devices placed therein which can come into contact with the film-forming material. When a PCB integrated with multiple components is coated, in order to control the thickness of coating layers of a particular device, such electronic devices need to be shielded to protect the surface of the electronic devices from being coated, while a protective coating layer is still formed on surfaces of other parts of the PCB that are not shielded. For example, after the antenna elastic strip is coated, the impedance of the formed film layer can change a radio frequency performance of the antenna; after an optical device is coated, even a thin transparent film can change a transmission effect of the optical device; after an acoustic device is coated, even a thin film can affect a vibration of a diaphragm of the acoustic device to change the acoustic effect. Selecting an appropriate shielding method to meet coating requirements of the substrate is a difficulty in the coating technology.

At present, spotting glue and sticking paper are common shielding means satisfying the above-mentioned selective coating of the substrate. Before the coating, dispensing glue and sticking paper are performed on special shielded areas such as the surface of the electronic device and interfaces, and after the coating is finished, the shielded resin glue is peeled off or the sticking paper is torn off. This shielding manner will undoubtedly result in: (1) when the shielding is removed, a secondary damage of the electronic components is caused, and affects the performance of the electronic components; (2) the process of shielding and removing the shielding are usually carried out manually, which leads to a rise of labor cost and prolonging of coating time, and seriously affects the coating efficiency; (3) the resin glue and sticking paper for shielding cannot be recycled, so that economic cost of the coating process is greatly increased, technical requirements are high, and mass production cannot be realized.

SUMMARY

One advantage of the present disclosure is to provide a coating method and a film layer thereof, wherein the coating method can prepare a thin film layer on a surface of some parts or some components on a surface of a substrate and prepare a thick film layer on a surface of other parts or other components on the surface of the substrate, thereby satisfying requirements of coating a thin film layer for some electronic components such as a circuit interface component on the substrate, and ensuring data transmission performance.

Another advantage of the present disclosure is to provide a coating method and a film layer thereof, wherein a thickness of the film layer formed on a surface of the circuit interface component is in a predetermined range, in order not to affect an electrical connection performance of the circuit interface component.

Another advantage of the present disclosure is to provide a coating method and a film layer thereof, wherein the coating method can prepare a thin film layer on the surface of some parts or components on the surface of the substrate and prepare a thick film layer on the surface of other parts or components through one coating by means of a coating chucking appliance simultaneously.

Another advantage of the present disclosure is to provide a coating method and a film layer thereof, wherein the coating method can prepare a thin film layer on the surface of some parts or components on the surface of the substrate and prepare a thick film layer on the surface of other parts or components by means of two or more coating processes.

Another advantage of the present disclosure is to provide a coating method and a film layer thereof, a plurality of film layers have different thicknesses, so as to adapt to different requirements of the thickness of the film layer on the surface of each component on the substrate.

Another advantage of the present disclosure is to provide a coating method and a film layer thereof, wherein the coating method does not require auxiliary supplies such as a sticking paper or a resin glue, and the coating chucking appliance can be recycled, thereby saving costs and requiring less skill for a worker.

Another advantage of the present disclosure is to provide a coating method and a film layer thereof, wherein the coating method can satisfy coating requirements of different thicknesses of a plurality of electronic components on the surface of the substrate by one coating process, thereby reducing coating times, improving coating efficiency and prolonging service life of a coating equipment.

Another advantage of the present disclosure is to provide a coating method and a film layer thereof, wherein the coating method can shield a plurality of electronic components or areas on the surface of the substrate all at once and complete coating by the coating chucking appliance, thereby satisfying the coating requirements of the substrate, effectively reducing coating steps and improving the coating efficiency.

Another advantage of the present disclosure is to provide a coating method and a film layer thereof, wherein the coating method enables to prepare coating layers on a plurality of surfaces or electronic components of the substrate to be coated in bulk, thereby realizing mass production.

Another advantage of the present disclosure is to provide a coating method and a film layer thereof, wherein the coating method can ensure a consistence of a shape specification of a plurality of film layers on the surface of the substrates so as to meet the requirements of normalized mass production.

Another advantage of the present disclosure is to provide a coating method and a film layer thereof, wherein the coating method can rapidly position and install the substrate, simplify the operation, unify the standard, and improve the installing efficiency.

Another advantage of the present disclosure is to provide a coating method and a film layer thereof, wherein the coating method can prevent the substrate from being deformed or damaged by an external impact.

Another advantage of the present disclosure is to provide a coating method and a film layer thereof, wherein the coating method can maintain a relative stability of the substrate during coating, and prevent the substrate from being relatively shifted or shaked during coating, thus the substrate is not easily damaged, and coating reliability is ensured.

Another advantage of the present disclosure is to provide a coating method and a film layer thereof, wherein the coating method can coat a plurality of substrates simultaneously so as to increase the coating efficiency.

Another advantage of the present disclosure is to provide a coating chucking appliance and its application, wherein the coating chucking appliance can shield a plurality of electronic components not to be coated in the coating process on the surface of the substrate, so as to satisfy the coating requirement of the substrate and facilitate mass production.

Another advantage of the present disclosure is to provide a coating chucking appliance and its application, wherein the coating chucking appliance can shield a plurality of electronic components not requiring coating simultaneously, while other electronic components requiring coating are not shielded, thereby satisfying the coating requirement.

Another advantage of the present disclosure is to provide a coating chucking appliance and its application, wherein one coating can satisfy different coating requirements of different thicknesses on a plurality of electronic components on the surface of the substrate respectively, which can reduce times of coating, save labor and time, improve the coating efficiency, and prolong the service life of the coating equipment.

Another advantage of the present disclosure is to provide a coating chucking appliance and its application, wherein for the electronic components requiring coating on the surface of the substrate, the coating chucking appliance does not shield the electronic components requiring coating, and satisfies the requirement of uniform coating of the electronic component requiring coating.

Another advantage of the present disclosure is to provide a coating chucking appliance and its application, wherein for the electronic components not requiring coating on the surface of the substrate, the coating chucking appliance shields the electronic components not requiring coating, thus the electronic components not requiring coating cannot be coated.

Another advantage of the present disclosure is to provide a coating chucking appliance and its application, wherein for the electronic component requiring coating a thin film on the surface of the substrate, the coating chucking appliance can have a coating gap with a certain distance from the electronic component requiring coating a thin film, so that exposed portions of the electronic component requiring coating a thin film relative to the substrate are coated with a thin film.

Another advantage of the present disclosure is to provide a coating chucking appliance and its application, wherein for the electronic component requiring partial coating, the coating chucking appliance shields a portion of the electronic component not requiring coating, while other portions of the electronic component are not shielded, so that the electronic component is partially coated to meet needs of users.

Another advantage of the present disclosure is to provide a coating chucking appliance and its application, wherein the coating chucking appliance can be recycled without replacing new sticking paper in every coating, which saves cost, and does not affect performance of the electronic component after coating, and improves production efficiency.

Another advantage of the present disclosure is to provide a coating chucking appliance and its application, wherein the coating chucking appliance can meet the requirement of simultaneously coating multiple substrates, which improves production efficiency and meets the requirement of industrialized mass production.

Another advantage of the present disclosure is to provide a coating chucking appliance and its application, wherein the coating chucking appliance can maintain a relative stability of the substrate during coating, and prevents the substrate from being deviation or shaking in the coating process, thus the substrate is not easy to be damaged, and the coating reliability is ensured.

Another advantage of the present disclosure is to provide a coating chucking appliance and its application, wherein the coating chucking appliance can prevent the substrate from being deformed or damaged under an impact of an external force.

Another advantage of the present disclosure is to provide a coating chucking appliance and its application, wherein the coating chucking appliance can be adapted for the coating requirements of substrates with different thickness or size.

Another advantage of the present disclosure is to provide a coating chucking appliance and its application, wherein the substrate can be quickly positioned and installed by the coating chucking appliance, simple operation is realized, standard is unified and production efficiency is improved.

Another advantage of the present disclosure is to provide a coating chucking appliance and its application, wherein the coating chucking appliance can be customized according to a structural size of the substrate to meet market demands.

Another advantage of the present disclosure is to provide a coating chucking appliance and its application, wherein the coating chucking appliance has the advantages of simple structure, low cost, high durability and recyclability.

An embodiment of the present disclosure provides a coating method, including: forming a thick film layer on a first component on a surface of a substrate; and forming at least one thin film layer on a second component on the surface of the substrate, wherein a thickness of the thick film layer is greater than a thickness of the thin film layer.

Another embodiment of the present disclosure provides a film layer, wherein the film layer is formed on a substrate and includes a thick film layer formed on a surface of a first component of the substrate and a thin film layer formed on a surface of a second component of the substrate, and a thickness of the thick film layer is greater than a thickness of the thin film layer.

Another embodiment of the present disclosure provides a coating chucking appliance, including: a chucking body; and at least one shielding component configured on the chucking body; wherein the chucking body has at least one installing chamber for installing at least one substrate, and a position of the shielding component corresponds to a position of at least one electronic component on a surface of the substrate; wherein after installation, the shielding component correspondingly shields the electronic component on the surface of the substrate to meet a shielding requirement of the electronic component on the surface of the substrate when the substrate is coated.

Another embodiment of the present disclosure provides an installation method of a coating chucking appliance, including: installing at least one shielding component on at least one substrate respectively, wherein the shielding component shields a non-coating electronic component on a surface of the substrate; and installing the substrate in at least one installing chamber of a chucking body and exposing a part to be coated on the surface of the substrate.

Another embodiment of the present disclosure provides an installation method of a coating chucking appliance, including: fixing at least one shielding component on an inner wall of at least one installing chamber of a chucking body; and installing at least one substrate in the installing chamber of the chucking body, wherein the shielding component shields an electronic component not to be coated on a surface of the substrate, and a part to be coated on the surface of the substrate is exposed.

DETAILED DESCRIPTION

Figure 1:
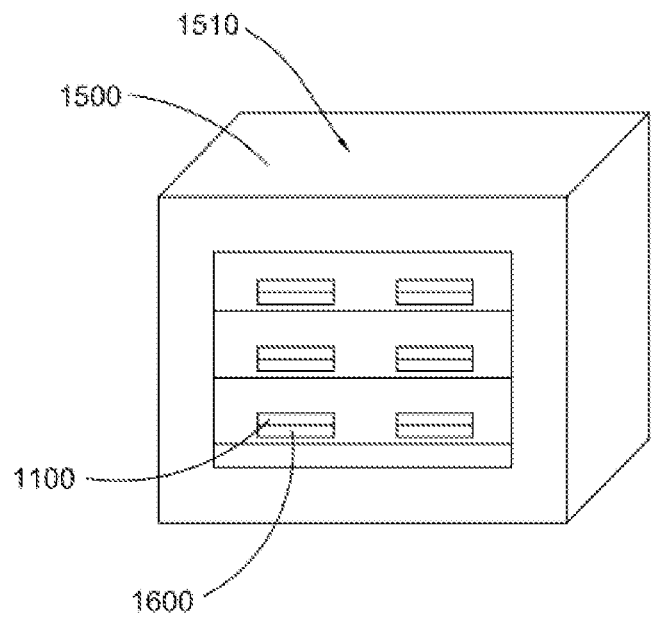
FIG. 1 is a schematic view showing a coating method of forming a film layer by a coating equipment according to an embodiment of the present disclosure.

The following description is used to disclose the present disclosure in order to enable one skilled in the art to practice the disclosure. Preferred embodiments in the following description are given by way of example only, and other obvious variations will occur to those skilled in the art. The basic principles of the present disclosure defined in the following description can be applied to other embodiments, variations, modifications, equivalents, and other technical schemes without departing from the scope of the present disclosure.

It should be appreciated by those skilled in the art that, in the context of the present disclosure, terms "longitudinal", "lateral", "upper", "lower", "front", "back", "left", "right", "vertical", "horizontal", "top", "bottom", "inner", "outer" are based on orientation or positional relationships illustrated in the figures, which are merely for convenience in describing and simplifying the present disclosure, and do not indicate or imply that devices or components must have a particular orientation and be constructed and operated in a particular orientation, thus the above terms should not be construed as limiting the present disclosure.

It should be understood that the term "a" or "an" should be interpreted as "at least one" or "one or more", that is, in some embodiments, the number of one component may be one, and in other embodiments, the number of the component may be multiple, thus the term "a" and "an" should not be construed as limiting the number.

In the description of this specification, the description referring to the terms "one embodiment", "some embodiments", "examples", "specific examples", or "some examples" means that specific features, structures, materials or features described in connection with the embodiments or examples are included in at least one embodiment or example of the present disclosure. In this specification, schematic expression of the above terms does not have to be directed to the same embodiment or example. Moreover, the specific features, structures, materials or features described may be combined in any one or more embodiments or examples in a suitable manner. In addition, without contradiction, those skilled in the art can combine different embodiments or examples described in this specification and the features of different embodiments or examples.

FIGS. 1 to 9 show a coating method according to some embodiment of the present disclosure. The coating method is applied to at least one coating device 1500, and the coating method can meet requirements of forming a thin film layer on a surface of some parts or components on a surface of at least one substrate 1600 and forming a thick film layer on the surface of other parts or components, so as to meet the requirements of coating a thin film layer on some electronic components of the substrate, such as an circuit interface component.

In some embodiments, the coating method is realized by means of at least one coating chucking appliance 1100 to prepare a thin film layer on the surface of some parts or components on the surface of the substrate, and prepare a thick film layer on the surface of other parts or components. That is, in the coating process, the substrate 1600 is installed in the coating chucking appliance 1100 and placed in a coating equipment 1500 for coating, so as to prepare films with different thicknesses at different parts of the substrate 1600 by one or more coatings. In other words, the film layers prepared on the surface of the substrate 1600 by the coating method have different thicknesses, so as to be adaptively formed on the surface of each component on the substrate 1600 with different requirements of the thickness of the film layers. For example, forming a thin film layer on a surface of the circuit interface component of the substrate 1600, such as an adapter, a USB socket. The film layer, such as a waterproof film, realizes a waterproof effect of the circuit interface component, and does not affect a data transmission performance of the circuit interface component due to a thinner thickness of the thin film layer.

Figure 2:
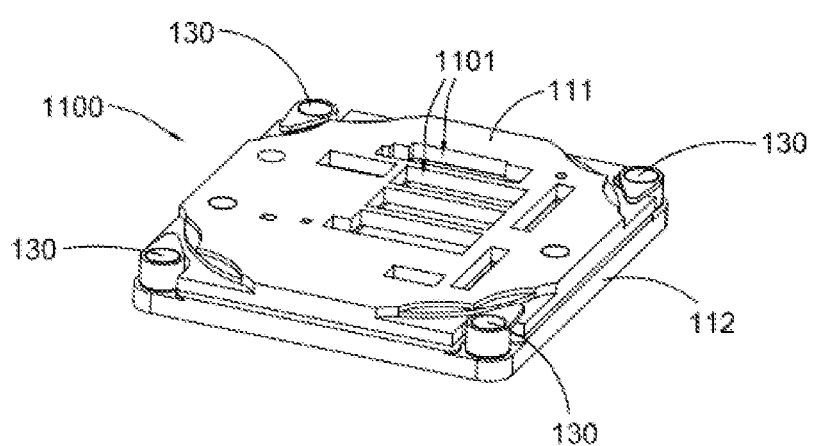
FIG. 2 is a schematic view of a coating chucking appliance according to an embodiment of the present disclosure.
Figure 3:
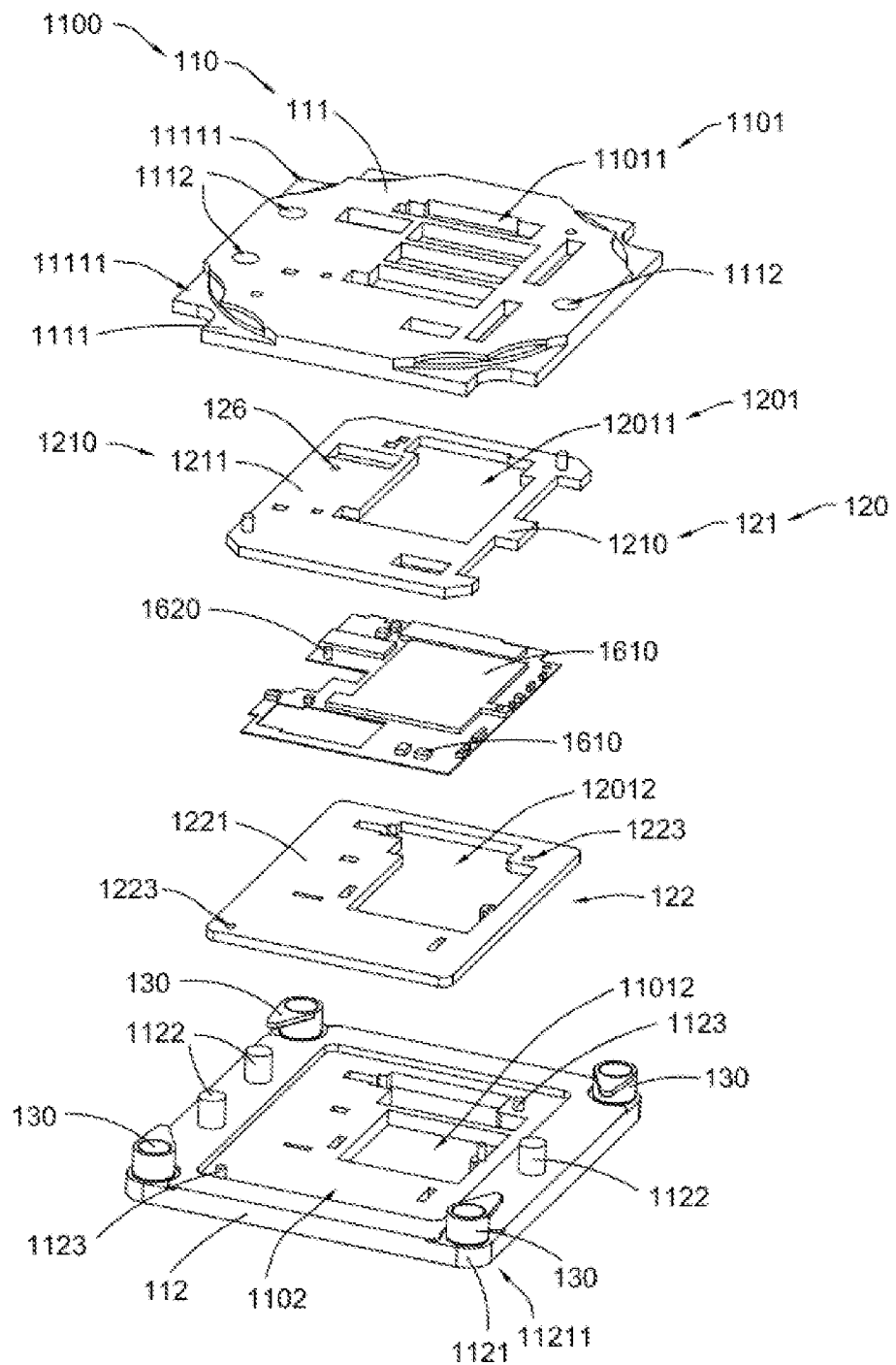
FIG. 3 is an exploded schematic view of the coating chucking appliance according to an embodiment of the present disclosure.

As shown in FIG. 2 and FIG. 3, the coating chucking appliance 1100 includes a chucking body 110 and at least one shielding component 120. The chucking body 110 has at least one exposed hole 1101 and at least one installing chamber 1102. The exposed hole 1101 is communicated with the installing chamber 1102, and the shielding component 120 is arranged on the chucking body 110. The substrate 1600 is fixedly and held in the installing chamber 1102 of the chucking body 110. The substrate 1600 has at least one electronic component 1610, and the shielding component 120 exactly shields positions such as the electronic component 1610 or areas not requiring coating or requiring partial coating on the surface of the substrate 1600. The exposed hole 1101 is communicated to the outside, and a part or the electronic component 1610 requiring coating on the surface of the substrate 1600 is exposed to the exposed hole 1101 to perform the coating, so as to meet the coating requirements of the substrate 1600. It can be seen that workers do not need to use additional auxiliary supplies such as a sticking paper or resin glue to shield the positions requiring coating on the substrate 1600. The coating chucking appliance 1100 can be recycled, so as to save costs and have low requirements for operation skills of the workers.

That is, before coating, the substrate 1600 is installed in the installation chamber 1102 of the coating chucking appliance 1100, and the position of the substrate 1600 that does not need coating is shielded by the shielding component 120 of the coating chucking appliance 1100. At the same time, the position of the substrate 1600 that needs coating is exposed through the exposed hole 1101, that is, not shielded. During coating, the worker needs to place the substrate 1600 installed to the coating chucking appliance 1100 into a coating chamber 1510 of the coating equipment 1500 to realize coating. After coating, the substrate 1600 can be removed from the installing chamber 1102 of the coating chucking appliance 1100. The unshielded electronic component or position on the surface of the substrate 1600 is coated with the film layer 1700, and the shielded electronic component or position on the surface of the substrate 1600 is not coated.

It should be noted that a plurality of substrates 1600 can be represented as a first substrate 1601, a second substrate 1602, a third substrate, and so on. Correspondingly, a plurality of film layers 1700 coated on each substrate 1600 can be represented as a first film layer 1701, a second film layer 1702, a third film layer, and so on. The shape or type of each substrate 1600 may be the same or different, and the shape, thickness or material of each film layer 1700 may be the same or different, which is not limited here.

Figure 7:
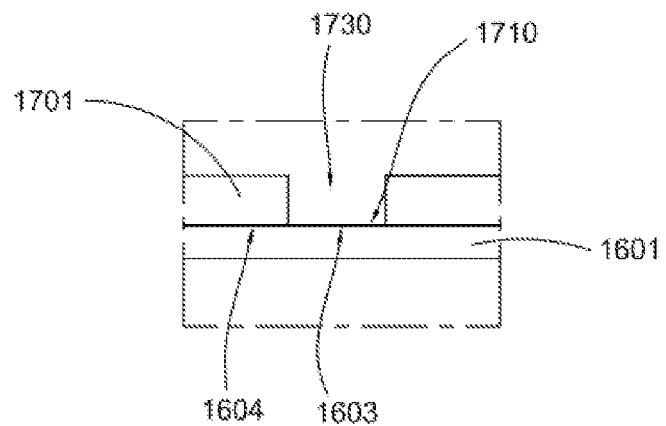
FIG. 7 is a partial cross-sectional schematic view of a film layer prepared on a surface of a first substrate by the coating method using the coating chucking appliance according to an embodiment of the present disclosure.

As shown in FIG. 7, specifically, the coating method includes following steps.

S10. The first substrate 1601 is installed to the coating chucking appliance 1100 and placed in the coating chamber 1510 of the coating equipment 1500 for coating. The first film layer 1701 is prepared on the electronic component or position which is not shielded by the coating chucking appliance 1100 on the surface of the first substrate 1601, and at least one first non-film area 1710 is formed on the surface of the first substrate 1601 that is shielded by the coating chucking appliance 1100. The first film layer 1701 is not prepared on the electronic component or position which is shielded by the coating chucking appliance 1100 on the surface of the first substrate 1601.

S20. The first substrate 1601 is disassembled from the coating chucking appliance 1100 to expose the electronic component or position without forming the first film layer 1701 on the surface of the first substrate 1601 to the first non-film area 1710, so as to ensure a normal working performance of the electronic component on the surface of the first substrate 1601. The electronic component, such as an antenna elastic strip, an optical device such as a distance sensor, a camera module or an acoustic device, is not coated with the film layer 1700, so as to improve the normal working performance of the electronic component.

It can be understood that the coating equipment 1500 may be a vacuum coating equipment. The coating equipment 1500 provides the coating chamber 1510 with high vacuum, that is, the coating chamber 1510 is not absolute vacuum. For example, the vacuum of the coating chamber 1510 is approximately 0.1 to 20 Pa. The coating chucking appliance 1100 and the substrate 1600 are assembled and placed to the coating chamber 1510 to complete coating. Alternatively, the coating type of the coating equipment 1500 can be vacuum ion evaporation, magnetron sputtering, MBE molecular beam epitaxy, PLD laser sputtering deposition, physical vapor deposition or plasma chemical vapor deposition, and its working principle is not described here. Alternatively, the film layer 1700 includes a film, thin film or nano film layer coated on the surface of the substrate 1600. Alternatively, the film layer 1700 can be implemented as a an organosilicon nano protective film layer, an organosilicon hard nano protective film layer, a composite structure high insulation hard nano protective film layer, a high insulation nano protective film layer with a modulation structure, a plasma polymerization film layer, a gradient increasing structure liquid-proof film layer, a gradient decreasing structure liquid-proof film layer, a film layer with a controllable crosslinking degree, a water-proof and electric breakdown-resistant film layer, a low adhesion and corrosion-resistant film layer, a liquid-proof film layer with a multilayer structure, a polyurethane nano film layer, an acrylamide nano film layer, an anti-static and liquid-proof nano film layer, an epoxy nano film layer, a high transparency and low color difference nano film layer, a high adhesion aging-resistant nano film layer, a silicon-containing copolymer nano film layer or a polyimide nano film layer, etc. Accordingly, the coating device 1500 can be implemented to coat any one or more of above films or film layers on the surface of the substrate 1600 so as to improve surface properties of the substrate 1600, which is not limited here.

In the coating process, after the substrate 1600 and the coating chucking appliance 1100 are assembled and placed into the coating chamber 1510, the coating chamber 1510 of the coating equipment 1500 is subjected to a negative pressure generation operation, such as a vacuum pumping. Then, by introducing reaction raw materials or auxiliary raw materials required for forming the film layer into the coating chamber 1510 to generate a plasma activated chemical vapor deposition reaction by a radio frequency and/or high voltage pulse power source, the film layer 1700 is prepared on the electronic component or position that is not shielded by the coating chucking appliance 1100 on the surface of the substrate 1600. For example, the parameters of the coating equipment 1500 in the coating process are as follows: air intake: HE: 10-200 sccm, perfluorooctyl ethyl acrylate: 10-300 sccm, the vacuum degree of the coating chamber 510 before coating: less than 10 Pa, the vacuum degree of the coating chamber 510 during coating: 0.1-20 Pa; using RF pulse power supply for coating, output voltage: 10-300V, duty cycle: 5-100%, frequency: 20-360 khz, coating time: 0.1-5 hrs. This is only an example and does not limit the present disclosure.

For example, the substrate 1600 may be a PCB circuit board. The substrate 1600 has a plate-shaped structure. The electronic component 1610 is arranged on the surface of the substrate 1600, and the coating chucking appliance 1100 is adapted to the substrate 1600, that is, the shape and size of the substrate 1600 matches the shape and size of the installing chamber 1102, so that the substrate 1600 is fixedly installed in the installing chamber 1102 of the coating chucking appliance 1100, and the part or electronic components that do not need coating on the surface of the substrate 1600 are shielded by the shielding component 120 or the chucking body 110, while the part or electronic components that need coating on the surface of the substrate 1600 are exposed to the exposed hole 1101 to meet the coating requirements.

Those skilled in the art should understand that the substrate 1600 can also be implemented as products with other shapes and structures to be coated, such as mobile phones, electronic devices, electronic device housings, keyboard films or other types of products to be coated, which are not limited here. Accordingly, the shape and structure of the coating chucking appliance 1100 can just adapt to the shape and structure of the substrate 1600, so that the substrate 1600 can just be fixedly installed in the installing chamber 1102 of the coating chucking appliance 1100, and the part to be coated is shielded by the shielding component 120, so as to realize the coating demand That is, the coating chucking appliance 1100 can be customized according to structural dimensions of different types of the substrate 1600 to meet market demands.

In some embodiments, the chucking body 110 and the shielding component 120 of the coating chucking appliance 1100 can be removed and installed repeatedly, so that a plurality of substrates 1600 can be installed on the coating chucking appliance 1100 circularly, and a unified coating can be realized without replacing new sticking paper every time. Moreover, the shape and specification of the film layer 1700 coated on the surface of each substrate 1600 are basically unified, which improves the production efficiency and meets the requirements of standardized mass production, whiling realizing a low cost and a high durability and recyclability.

Figure 8:
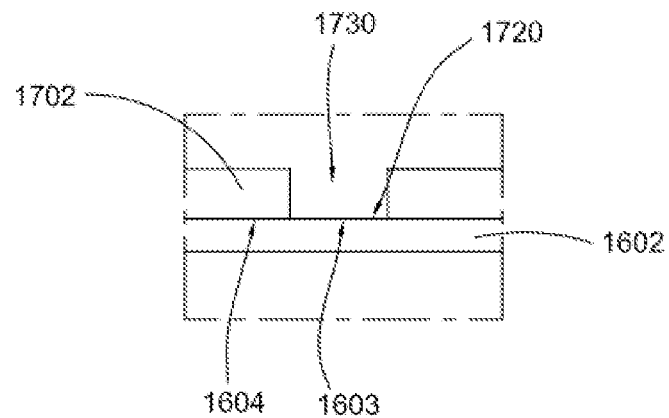
FIG. 8 is a cross-sectional partial schematic view of a film layer prepared on a surface of a second substrate by the coating method using the coating chucking appliance according to an embodiment of the present disclosure.

As shown in FIG. 8, the coating method further includes following steps.

S30. The second substrate 1602 is installed to the coating chucking appliance 1100 and placed into the coating chamber 1510 of the coating equipment 1500 for coating. The second film layer 1702 is formed on the electronic component or position that is not shielded by the coating chucking appliance 1100 on the surface of the second substrate 1602, and at least one second non-film area 1720 is formed on the electronic component or position that is shielded by the coating chucking appliance 1100 on the surface of the second substrate 1602. The electronic component or position where the second film layer 1702 is not formed on the electronic component or position that is shielded by the coating chucking appliance 1100 surface of the second substrate 1602.

S40. The second substrate 1602 is disassembled from the coating chucking appliance 1100 to expose the electronic component or position without forming the second film layer 1702 on the surface of the second substrate 1602 to the second non-film area 1702, so as to ensure a normal working performance of the electronic component on the second substrate 1602.

It can be understood that the first substrate and the second substrate are successively installed to the same coating chucking appliance 1100 and then placed into the coating chamber 1510 of the coating equipment 1500 for coating. The shape and size of the first substrate and the second substrate are basically consistent, that is, the first substrate and the second substrate are adaptively installed to the coating chucking appliance 1100, and positions of the first substrate and the second substrate shielded by the coating chucking appliance 1100 are basically consistent, so that the first substrate and the second substrate can be coated with the film layer 1700 at the same position during coating. That is, the shape and size of the first film layer 1701 and the second film layer 1702 are basically the same. Accordingly, the shape, size, quantity and position of the first non-film area 1701 and the second non-film area 1702 are also basically the same.

It should be noted that the material or thickness of the first film layer and the second film layer can be the same or different. That is, in the coating process, when the type or quantity of materials filled into the coating chamber 1510 of the coating device 1500 is different, or the coating time, voltage or other parameters of the coating device 1500 are different, the material or thickness of the first film layer formed on the surface of the first substrate and the second film layer on the surface of the second substrate are also different. When the type and quantity of materials filled into the coating chamber 1510 of the coating equipment 1500 and the coating time and other parameters are the same, the material and thickness of the first film layer and the second film layer can be basically consistent, so as to realize unification.

In some embodiments, the substrate 1600 (i.e., the first substrate 1601 or the second substrate 1602) has at least one non-coating position 1603 and at least one first component 1604. The non-coating position 1603 includes a non-coating electronic component on the surface of the substrate 1600, such as an antenna elastic strip, an optical device such as a distance sensor, a camera module or an acoustic device. The first component 1604 includes a substrate surface of the substrate 1600, a circuit and an electronic component that can be coated.

Accordingly, when the substrate 1600 is installed to the coating chucking appliance 1100, the non-coating position 1603 is shielded by the chucking body 110 or the shielding component 120, and the first component 1604 is exposed to the exposed hole 1101 without being shielded by the coating chucking appliance 1100.

Specifically, in S10, the first film layer 1701 is formed on the first component 1604 on the surface of the first substrate 1601, and in S20, the first non-film area 1710 is formed on the non-coating position 1603 of the first substrate 1601. Further, the first non-film area 1710 includes, but is not limited to, a hole type or groove type area, so as to adapt to the shape or structure of the non-coating position 1603 of the first substrate 1600.

Accordingly, in S30, the second film layer 1702 is formed on the first component 1604 on the surface of the second substrate 1602, and in S40, the second non-film area 1720 is formed on the non-coating position 1603 of the second substrate 1602.

During coating, since the non-coating position 1603 of the substrate 1600 is shielded by the shielding component 120 of the coating chucking appliance 1100 and thus cannot be coated with the film layer 1700 so as to form the first non-film area 1710 and the second non-film area 1720 respectively, each non-film area (i.e., the first non-film area 1710 or the second non-film area 1720) is consistent with a shielding surface of corresponding shielding component 120 in shape or number, and the number or shape of a plurality of first non-film areas 1710 or a plurality of second non-film areas 1720 respectively corresponds to the number or shape of a plurality of non-coating positions 1603.

For example, if the shielding surface of the shielding component 120 has a circular shape, the film-free area (i.e., the first non-film area 1710 or the second non-film area 1720) also has a circular shape with the same size. Alternatively, the shape of the shielding surface of the shielding component 120 can also be square, triangular, quadrilateral, polygonal or irregular, and the film free-area (i.e., the first non-film area 1710 or the second non-film area 1720) correspondingly has the same shape and size as the shielding surface of the shielding component 120.

Figure 5:
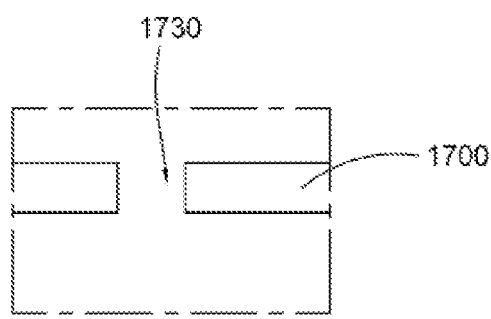
FIG. 5 is a schematic cross-sectional view of a film hole of the film layer prepared by the coating method using the coating chucking appliance according to an embodiment of the present disclosure.
Figure 6:
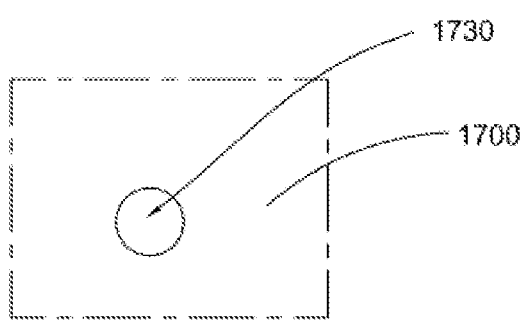
FIG. 6 is a schematic plan view of the film hole of the film prepared by the coating method using the coating chucking appliance according to an embodiment of the present disclosure.

As shown in FIGS. 5 and 6, in other words, the film layer 1700 has at least one film hole 1730, and the film layer 1700 is coated on the first component 1604 of the substrate 1600. The film hole 1730 is arranged on the non-coating position 1603 of the substrate 1600 so as to form the non-film area (i.e., the first non-film area 1710 and the second non-film area 1720). Alternatively, the film hole 1730 includes, but is not limited to an annular hole or an edge hole. A periphery of the annular hole is completely surrounded by the film layer 1700, and the annular hole may be a circular hole, a square hole or an irregular hole etc. The edge hole is arranged at the edge of the film layer 1700, and the edge hole may be a semi-annular hole, an arc hole, a semi-circular hole, etc.

When the film layer 1700 is coated on the first component 1604 of the substrate 1600, the non-coating position 1603 of the substrate 1600 is arranged on a bottom of the film hole 1730 and forms a groove structure with the film hole 1730. Of course, since the thickness of the film layer 1700 is nanoscale and the depth of the film hole 1730 is nanoscale, the groove structure is substantially imperceptible to a human hand touch.

As shown in FIGS. 4 to 9, further, some embodiments of the present disclosure also provide the film layer 1700 prepared by the coating method. The film layer 1700 has the film hole 1730, and the film layer 1700 is coated on the surface of the substrate 1600. The film hole 1730 is located at the non-coating position 1603 of the substrate 1600 and forms the non-film area (i.e., the first non-film area 1710 and the second non-film area 1720). Alternatively, the film layer 1700 includes at least one thick film layer 17012 formed on the surface of the first component 1604 on the substrate 1600 and at least one thin film layer 17011 formed on a surface of a second component 1605 of the substrate 1600. The thickness of the thick film layer 17012 is greater than the thickness of the thin film layer 17011.

As shown in FIG. 3, more specifically, the chucking body 110 includes a first body 111 and a second body 112, and the first body 111 and the second body 112 are openably installed together, such as by a clamp connection. The installing chamber 1102 is formed between the first body 111 and the second body 112 to facilitate the installation of the substrate 1600. In some embodiments, both sides of the chucking body 110 are provided with the exposed hole 1101. Specifically, the exposed hole 1101 includes at least one first exposed hole 11011 and at least one second exposed hole 11012. The first exposed hole 11011 is opened in the first body 111 and communicated with the installing chamber 1102, and the second exposed hole 11012 is opened in the second body 112 and communicated with the installing chamber 1102. Therefore, after the substrate 1600 is installed in the installing chamber 1102 of the chucking body 110, one part on one side of the substrate 1600 is exposed to the first exposed hole 11011 and another part on the other side is exposed to the second exposed hole 11012, so that the exposed parts on both sides of the substrate 1600 can be coated or coated at the same time.

Accordingly, the shielding component 120 includes at least one first shielding component 121 and at least one second shielding component 122. The first shielding component 121 is arranged between the first body 111 and one side of the substrate 1600 and is used to correspondingly shield the electronic component 1610 not to be coated on a side surface of the substrate 1600, and the second shielding component 122 is arranged between the second body 112 and the other side of the substrate 1600 and is used to correspondingly shield the electronic component 1610 not to be coated on another side surface of the substrate 1600, so as to meet the requirements of simultaneous coating on both sides of the substrate 1600, and ensure that electronic components 1610 not to be coated on both sides of the substrate 1600 cannot be coated with the film or film layer.

It should be noted that the first shielding component 121 and the second shielding component 122 can cooperate with each other to shield the same electronic component 1610 on the surface of the substrate 1600, for example, the electronic component 1610 on one side of the substrate 1600, which is not limited here.

Alternatively, the chucking body 110 may also be provided with the exposed hole 1101 on only on one side, so that corresponding side of the substrate 1600 can be coated, which is suitable for the case where the substrate 1600 is coated on only on one side. Alternatively, after one side of the substrate 1600 is coated, the substrate 1600 is reversely installed in the installing chamber 1102 of the chucking body 110 and coated again, so that the other side of the substrate 1600 is also coated, so as to meet the demand of coating the substrate 1600 on both sides.

Alternatively, when only one side surface of the substrate 1600 has the electronic component 1610 not to be coated, the first shielding component 121 is arranged between the first body 111 and the side of the substrate 1600 and used to shield the electronic component 1610 not to be coated on the side surface of the substrate 1600, while the second shielding component 122 may not be required between the second body 111 and the other side of the substrate 1600, or the second shielding component 122 does not shield the part or electronic component to be coated on the other side surface of the substrate 1600, so as to meet the coating requirements of the substrate 1600.

In some embodiments, the first body 111 and the second body 112 of the chucking body 110 are made of a hard material, such as a metal material. The first body 111 and the second body 112 have strong hardness and are not easy to bend and deform. The first body 111 and the second body 112 are clamped and fixed with each other, and the substrate 1600 is placed in the installing chamber 1102 between the first body 111 and the second body 112, so as to protect the substrate 1600 from being bent and damaged, and prevent the substrate 1600 from deformed or damaged under the impact of an external force.

In some embodiments, the first shielding component 121 and the second shielding component 122 of the shielding component 120 are made of a flexible material, such as a silica gel material. The first shielding component 121 and the second shielding component 122 are respectively arranged on both sides of the substrate 1600, and are clamped and fixed by the first body 111 and the second body 112 of the chucking body 110, so as to buffer and protect the substrate 1600. At the same time, the relative stability of the substrate 1600 during coating is maintained, the relative shifting or shaking of the substrate 1600 during coating is prevented, and the substrate 1600 is not easy to be damaged, so as to ensure the reliability of coating. That is, the first shielding component 121 further plays a buffer protection role between the first body 111 and the substrate 1600, and the second shielding component 122 further plays a buffer protection role between the second body 112 and the substrate 160. That is, the first shielding component 121 and the second shielding component 122 can protect the substrate 1600 from being damaged while playing a shielding role on both sides of the substrate 1600.

It is should be noted that the first shielding component 121 and the second shielding component 122 of the shielding component 120 respectively fit flush against the surface of the substrate 1600 smoothly, wherein the first body 111 of the chucking body 110 fits flush against the first shielding component 121 smoothly, and the second body 112 fits flush against the second shielding component 122 smoothly, so as to ensure that the overall stress of the substrate 1600 is uniform and prevent stress concentration, thus the substrate 1600 is prevented from being bent or damaged. Further, the surfaces of both sides of the chucking body 110 are flat, so that the chucking body 110 can be stable when placed in the vacuum coating chamber of the coating equipment, and at the same time, the substrate 1600 is ensured to be stable and not easy to shake to affect the coating.

It can be seen that the chucking body 110 and the shielding component 120 of the coating chucking appliance 1100 can be removed and installed repeatedly, so that a plurality of substrates 1600 can be installed to the coating chucking appliance 1100 circularly. Thus, the coating can be realized without replacing new sticking paper every time, and the performance of the electronic component 1610 after coating is not affected, which can save cost, improve production efficiency, satisfy mass production requirements, and have low cost, high durability and recyclability.

Figure 4:
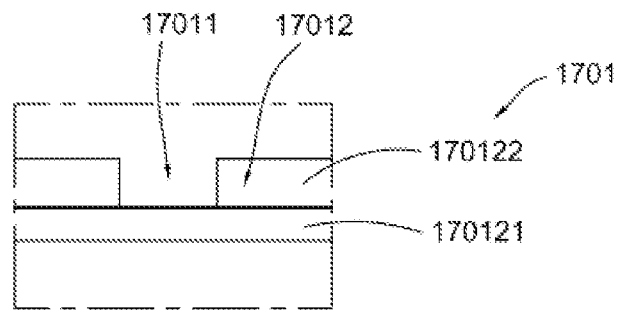
FIG. 4 is a partial cross-sectional schematic view of a film layer prepared by the coating method using the coating chucking appliance according to an embodiment of the present disclosure.
Figure 9:
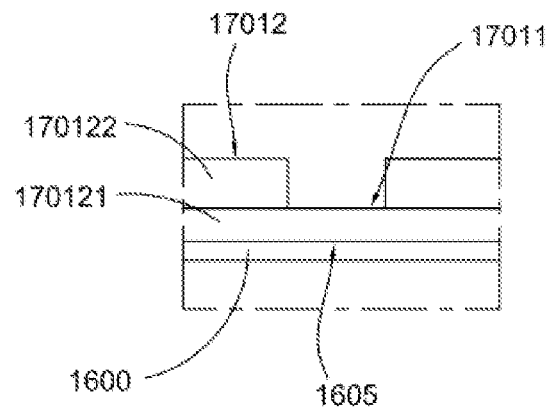
FIG. 9 is a cross-sectional partial schematic view of a thin film layer prepared on a surface of a substrate by the coating method using the coating chucking appliance according to an embodiment of the present disclosure.
Figure 10:
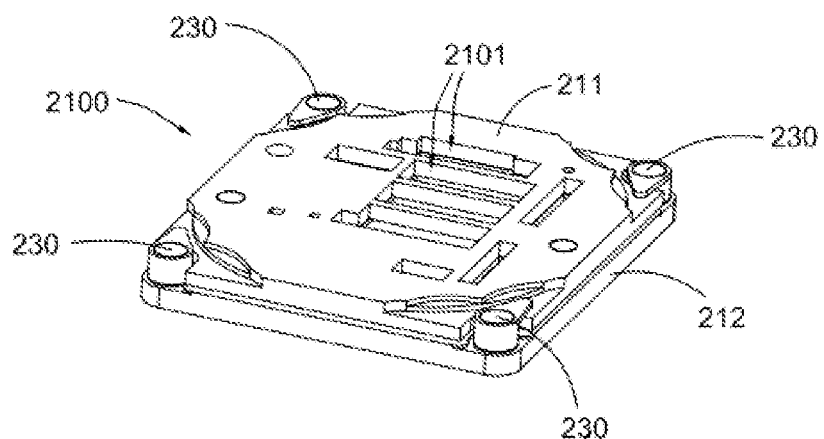
FIG. 10 is a structural schematic view of a coating chucking appliance according to an embodiment of the present disclosure.

As shown in FIGS. 4 and 9, the surface of the substrate 1600 also includes at least one second component 1605. The second component 1605 includes at least one electronic component to be coated with a thin film, such as a circuit interface component, such as an adapter, a USB interface. Further, the film layer 1700 (i.e., the first film layer 1701 or the second film layer 1702) includes a thin film layer 17011 and a thick film layer 17012 (taking the first film layer 1701 as an example) integrally connected with each other. The thin film layer 17011 is coated on the second component 1605 of the substrate 1600. In other words, a thickness of the thin film layer 17011 is less than a thickness of the thick film layer 17012 of the first film layer 1701, that is, the thickness of the thin film layer 17011 on the surface of the second component 1605 is less than the thickness of the thick film layer 17012 on the surface of the first component 1604. Further, in order not to affect the electrical connection performance of the second component 1605 such as the circuit interface component, the thickness of the thin film layer 17011 prepared on the surface of the second component 1605 is within a preset range.

Further, the electronic component 1610 on the surface of the substrate 1600 is selected from one or more combinations of at least one electronic component 1611 to be coated, at least one electronic component 1612 not to be coated, at least one electronic component 1613 to be partially coated and at least one electronic component 1614 to be coated with a thinner coating layer. That is, the electronic component 1611 to be coated and a to-be-coated part 16131 of the electronic component 1613 to be partially coated are positioned on the first component 1604 to be coated with the thick film layer 17012. The electronic component 1612 not to be coated and a non-coating part 16132 of the electronic component 1613 to be partially coated are positioned on the non-coating position 1603, and the electronic component 1614 to be coated with a thinner coating layer is positioned on the second component 1605 to be coated with the thin film layer 17011.

Further, the shielding component 120 further includes at least one shielding body 1210, and the shielding body 1210 may include at least one first shielding body 1211 and at least one second shielding body 1212. The first shielding component 121 includes the first shielding body 1211, and the second shielding component 122 includes the second shielding body 1212. The first shielding component 121 and the second shielding component 122 of the shielding component 120 further include one or more selected from a group consisting of at least one complete shielding part 123, at least one partial shielding part 124 and at least one suspended shielding part 125. The complete shielding part 123 adaptively covers or wraps the electronic component 1612 not to be coated at the non-coating position 1603 to achieve a complete shielding, the partial shielding part 124 adaptively covers or wraps the non-coating part 16132 of the electronic component 1613 to be partially coated to achieve a partial shielding, and the suspended shielding part 124 maintains a coating gap D1 from the electronic component 1614 to be coated with a thinner coating on the second component 1605 to achieve a suspended shielding, so as to coat the thin film layer 17011 on the surface of the electronic component 1614 to be coated with a thinner coating.

It can be understood that for different types of the substrate 1600, the shielding component 120 can be preset to have a combination of one or more of the complete shielding part 123, the partial shielding part 124 and the suspended shielding part 125. Alternatively, if the substrate 1600 only includes the electronic component 1612 not to be coated and the electronic component 1611 be to coated, the shielding component 120 is preset to have the complete shielding part 123, and may or may not have the partial shielding part 124 and the suspended shielding part 125. That is, the structure of the shielding component 120 can be preset according to the type and model of the substrate 1600, which is not limited here.

In some embodiments, the complete shielding part 123, the partial shielding part 124 and the suspended shielding part 125 are integrally connected. The complete shielding part 123 of the shielding component 120 corresponds to the position of the electronic component 1612 not to be coated on the substrate 1600, the partial shielding part 124 corresponds to the position of the non-coating part 16132 of the electronic component 1613 to be partially coated on the substrate 1600, and the suspended shielding part 125 corresponds to the position of the electronic component 1614 to be coated with a thinner coating on the substrate 1600. That is, the shielding component 120 of the coating chucking appliance 1100 can shield a plurality of electronic components 1610 not to be coated at the same time, while the other electronic components 1610 to be coated are not shielded, so as to meet the coating requirements.

Specifically, the first shielding component 121 has the first shielding body 1211, and the first shielding body 1211 has a first through hole 12011. The complete shielding part 123, the partial shielding part 124 and the suspended shielding part 125 are integrally formed on the first shielding body 1211. The second shielding component 122 has the second shielding body 1221, and the second shielding body 1221 has a second through hole 12012. The complete shielding part 123, the partial shielding part 124 and the suspended shielding part 125 are integrally formed on the second shielding body 1221.

That is, when the substrate 1600 is installed in the installing chamber 1102 of the coating chucking appliance 1100, the complete shielding part 123 correspondingly covers or wraps the electronic component 1612 not to be coated, the partial shielding part 124 correspondingly wraps or covers the non-coating part 16132 of the electronic component 1613 to be partially coated, and the suspended shielding part 125 exactly correspondingly maintains the coating gap D1 from the electronic component 1614 to be coated with a thinner coating.

During coating, since the electronic component 1611 to be coated and the to-be-coated part 16131 of the electronic component 1613 to be partially coated are not shielded by the shielding component 120, a certain amount of plasma will be deposited on the electronic component 1611 to be coated and the to-be-coated part 16131 of the electronic component 1613 to be partially coated to form the thick film layer 17012 with a certain thickness. The electronic component 1612 not to be coated and the non-coating part 16132 of the electronic component 1613 to be partially coated are shield, and plasma cannot be deposited, thus the coating or coating layer cannot be formed. The suspended shielding part 125 is suspended above an upper side of the electronic component 1614 to be coated with a thinner coating and has the coating gap D1 from the electronic component 1614 to be coated with a thinner coating, so that the suspended shielding part 125 will reduce the rate of plasma deposition on the surface of the electronic component 1614 to be coated with a thinner coating, resulting in the reduction of the thickness of the coating on the surface of the electronic component 1614 to be coated with a thinner coating, namely, forming the thin film layer 17011, and the spacing of the coating gap is preset, so as to coat the thin film layer 17011 with different thickness.

It should be noted that by presetting the height of the coating gap D1, the deposition rate of the plasma deposited on the surface of the electronic component 1614 to be coated with a thinner coating is changed accordingly, so that the surface of the electronic component 1614 to be coated with a thinner coating is coated with the thin film layer 17011 with a preset thickness. Accordingly, for a plurality of electronic components 1614 to be coated with a thinner coating, corresponding coating gap D1 between each electronic component 1614 to be coated with a thinner coating and a plurality of suspended shielding parts 125 of the shielding component 120 can be preset respectively, so that the coating equipment can meet the coating requirements of different thicknesses of the plurality of electronic components 1610 on the surface of the substrate 1600 through one coating, which can reduce the number of coating times, save manpower and time, improve the coating efficiency and prolong the service life of the coating equipment.

In some embodiments, a distance between the complete shielding part 123 of the shielding component 120 and the non-coating position 1603 of the substrate 1600 is between 0 and 1 mm During the coating process, a partially permeable gap can be allowed between the complete shielding part 123 and the non-coating position 1603, but will not affect the performance of the electronic component on the non-coating position 1603. Accordingly, in order not to affect the electrical connection performance of the circuit interface component, the thickness of the thin film layer 17011 should not be greater than 250 nm. Alternatively, when the coating gap D1 between the suspended shielding part 125 of the shielding component 120 and the electronic component 1614 to be coated with a thinner coating on the second component 1605 of the substrate 1600 is 0.5 mm, the coating thickness between the circuit interface component of the substrate 1600, such as the USB interface, and the suspended shielding part 125, that is, the thickness of the thin film layer 17011, can be controlled between 50 nm and 150 nm. Or, the coating gap D1 is between 0.2 and 0.8 mm. The upper side of the first component 1604 of the substrate 1600 may not be shielded by the shielding component 120. Alternatively, a coating thickness of the upper side of the first component 1604, that is, the thickness of the thick film layer 17012, is generally between 250 and 1000 nm, optionally, between 350 nm and 400 nm. In this way, the surface of the first component 1604 can still be prepared with a film of a required thickness. Those skilled in the art should understand that these ranges of data set forth above are merely illustrative of the present embodiment and are not intended to limit the present disclosure.

Accordingly, S10 includes following step.

S11. Forming the thick film layer 17012 on the first component 1604 of the substrate 1600, wherein the non-coating position 1603 of the substrate 1600 is shielded by the substrate 1600 without forming the film layer 1700.

In S11, the first component 1604 is not shielded by the coating chucking appliance 1100, and the non-coating position 1603 is completely shielded by the shielding component 120 of the coating chucking appliance 1100.

Further, S10 also includes steps performed simultaneously with S11:

S12. Forming the thin film layer 17011 on the second component 1605 of the substrate 1600.

In S12, the second component 1605 is spaced away from the suspended shielding part 125 of the coating chucking appliance 1100 by the coating gap D.

It can be seen that the coating method can respectively coat the thick film layer 17012 and the thin film layer 17011 at different positions on the surface of the substrate 1600 by one coating process, which improves the coating efficiency and saves the coating time.

Alternatively, the complete shielding part 123, the partial shielding part 124 and the suspended shielding part 125 can be arranged between the chucking body 110 and the substrate 1600 independently of each other. The complete shielding part 123 corresponds to the position of the electronic component 1612 not to be coated on the substrate 1600, the partial shielding part 124 corresponds to the position of the non-coating part 16132 of the electronic component 1613 to be partially coated on the substrate 1600, and the suspended shielding part 125 corresponds to the position of the electronic component 1614 to be coated with a thinner coating on the substrate 1600.

Alternatively, the first shielding component 121 and the second shielding component 122 can cooperatively shield the same electronic shielding component 1610 on the substrate 1600. Specifically, the substrate 1600 has at least one common shielded electronic component 1615, the common shielded electronic component 1615 is positioned on the side or hole edge of the substrate 1600, and the common shielded electronic component 1615 may be a USB interface or a socket. The first shielding component 121 has at least one first shielding part 1212, and the second shielding component has at least one second shielding part 1222. The first shielding part 1212 is positioned on the side or hole edge of the first shielding body 1211 of the first shielding component 121 and just corresponds to the position of the common shielded electronic component 1615, and the second shielding part 1222 is positioned on the side or hole edge of the second shielding body 1221 of the second shielding component 122 and just corresponds to the position of the common shielded electronic component 1615. The first shielding part 1212 and the second shielding part 1222 cooperatively cover or wrap the common shielded electronic component 1615 so that the common shielded electronic component 1615 cannot be coated. In other words, during shielding, the first shielding part 1212 and the second shielding part 1222 are correspondingly jointed with each other to cover the common shielded electronic component 1615, that is, a combined area of the first shielding part 1212 and the second shielding part 1222 is greater than or equal to a non-coating area of the common shielded electronic component 1615, so as to realize shielding and meet the coating requirements.

Further, a structural size of the chucking body 110 can be preset, wherein the height and shape of the installing chamber 1102 can be preset, and the shape, size and thickness of the shielding component 120 can be preset, so that the substrate 1600 with different thickness or size can be installed in the installing chamber 1102. Thus, the coating chucking appliance 1100 can be suitable for the coating requirements of substrates with different thicknesses or sizes.

In some embodiments of the present disclosure, the coating method can respectively coat the thick film layer 17012 and the thin film layer 17011 on the surface of the substrate 1600 by multiple coatings. For example, the coating method coats the thick film layer 17012 on the first component 1604 and the thin film layer 17011 on the second component 1605 through two coatings. The thick film layer 17012 includes a first film layer 170121 and a second film layer 170122 stacked integrally, a part of the second film layer 170122 not covered by the first film layer 170121 forms the thin film layer 17011, and the second film layer 170122 is between the surface of the substrate 1600 and the first film layer 170121. Alternatively, the first film layer 170121 is between the surface of the substrate 1600 and the second film layer 170122, and a part of the first film layer 170121 not covered by the second film layer 170122 forms the thin film layer 17011.

Specifically, the coating method includes following steps:

S50. The second component 1605 on the substrate 1600 is shielded by the complete shielding part 123 of the coating chucking appliance 1100 and placed into the coating chamber 1510 of the coating equipment 1500 for a first coating to form the first film layer 170121 on the surface of the first component 1604 on the substrate 1600, wherein the second component 1605 is not coated with the first film layer 170121.

S60. The second component 1605 on the substrate 1600 is not shielded by the coating chucking appliance 1100, and is again placed into the coating chamber 1510 of the coating equipment 1500 for a second coating to form the second film layer 170122 on the surface of the first film layer 170121 of the first component 1604 and the surface of the second component 1605.

After executing S50, that is, after the first coating, the worker needs to take out the substrate 1600 and the coating chucking appliance 1100 from the coating chamber 1100, remove the complete shielding part 123 of the coating chucking appliance 1100 shielding the first component 1604, and then put it into the coating chamber 1100 again for the second coating, that is, executing S60. After executing S60, the worker needs to take out and disassemble the substrate 1600 and the coating chucking appliance 1100 to obtain the final coating product.

That is, the part where the first film layer 170121 and the second film layer 170122 are stacked with each other forms the thick film layer 17012, and the part where the first film layer 170121 and the second film layer 170122 are not stacked with each other forms the thin film layer 17011.

It can be understood that the material and thickness of the first film layer 170121 and the second film layer 170122 can be preset to the same or different material or thickness respectively according to the parameters of the coating equipment or the setting of reaction raw materials in S50 and step S60, which is not limited here.

Alternatively, S50 can be replaced by:

S51. The second component 1605 on the substrate 1600 is not shielded by the coating chucking appliance 1100 and placed into the coating chamber 1510 of the coating equipment 1500 for the first coating to form the first film layer 170121 on the surface of the first component 1604 and the surface of the second component 1605.

Alternatively, S60 can be replaced by:

S61. The second component 1605 of the substrate 1600 is shielded by the complete shielding part 123 of the coating chucking appliance 1100 and again placed into the coating chamber 1510 of the coating equipment 1500 for the second coating to form the second film layer 170122 on the surface of the first film layer 170121 of the first component 1604 of the substrate 1600, and the surface of the first film layer 170121 of the second component 1605 is not coated with the second film layer 170122.

In other words, in S50 and S60, during the first coating, the coating chucking appliance 1100 shields the second component 1605 to form the first film layer 170121 on the surface of the first component 1604 separately. Then, during the second coating, the second component 1605 is not shielded by the coating chucking appliance 1100, so that the second film layer 170122 is formed on the surface of the first film layer 170121 of the first component 1604 and the second component 1605 at the same time. Thus, the surface of the second component 1605 is only coated with the second film layer 170122 to form the thin film layer 17011, while the surface of the first component 1604 is coated with films (i.e., the first film layer 170121 and the second film layer 170122) on both sides to form the thick film layer 17012. It can be seen that the thin film layer 17011 is significantly thinner than the thick film layer 17012.

In S51 and S61, during the first coating, the second component 1605 is not shielded by the coating chucking appliance 1100, so that the first film layer 170121 is formed on the surface of the first component 1604 and the second component 1605 at the same time. Then, during the second coating, the coating chucking appliance 1100 shields the second component 1605, so that the second film layer 170122 is formed separately on the surface of the first film layer 170121 of the first component 1604 to complete the coating and achieve the same effect.

It should be noted that in the coating method, a shielding component such as a sticking paper or a tape can be selected to replace the coating chucking appliance 1100 to shield the substrate 1600, and the thick film layer 17012 can be prepared on the surface of the first component 1604 of the substrate 1600, while the thin film layer 17011 can be prepared on the surface of the second component 1605, which is not limited here.

Alternatively, the coating method also includes a decoating step, and the decoating step includes: decoating a part of the film layer 1700 on the surface of the substrate 1600 to form a non-film area (i.e., the first non-film area 1710 or the second non-film area 1720) on the surface of the substrate 1600. Alternatively, the decoating step can select a process such as sanding for decoating, that is, after the coating is completed, the worker can remove the part of the film layer 1700 coated on the surface of the substrate 1600 through the decoating process, so as to form the non-film area for exposing the position or electronic components not to be coated on the surface of the substrate 1600.

In some embodiments, the coating chucking appliance 1100 also includes a set of fastening components 130, and the fastening components 130 are fixedly installed to the chucking body 110. Specifically, the fastening components are fixedly installed between the first body 111 and the second body 112, and the fastening components 130 can switch between a fastening state and a disassembling state. In the fastening state, a height of the installing chamber 1102 is reduced, and the fastening components 130 provide a force to keep the first body 111 and the second body 112 relatively fixed for clamping and fixing the substrate 1600 in the installing chamber 1102. In the disassembling state, the installing chamber is opened, and the force is removed, thus the first body 111 and the second body 112 can be separated from each other, so as to disassemble or install the substrate 1600 in the installing chamber 1102.

Alternatively, the fastening components 130 include at least four fastening components symmetrical to each other, and the fastening components 130 are respectively arranged at four corners of the chucking body 110, so that the chucking body 110 can be stressed evenly in the fastening state, so as to ensure the uniform stress of the substrate 1600 and prevent the substrate 1600 from being bene or damaged due to excessive stress concentration. Alternatively, the fastening components 130 can also include six or even more fastening components, which is not limited here.

Further, the first shielding component 121 and the second shielding component 122 of the shielding component 120 each have at least one first positioning part 126 respectively, and the substrate 1600 has at least one second positioning part 1620. A position of the first positioning part 126 corresponds to a position of the second positioning part 1620, and the first positioning part 126 and the second positioning part 1620 are fixed cooperatively, so that the shielding component 120 exactly fit flush against the substrate 1600. Specifically, the complete shielding part 123 of the shielding part 120 correspondingly covers or wraps the electronic component 1612 not to be coated, the partial shielding part 124 correspondingly covers or wraps the non-coating part 16132 of the electronic component 1613 to be partially coated, and the suspended shielding part 125 exactly correspondingly maintains the coating gap D1 from the electronic component 1614 to be coated with a thinner coating, so that the first shielding part 121 and the second shielding part 122 can be quickly positioned and installed on both sides of the substrate 1600, and realize shielding demand at the same time, prevent dislocation, accelerate the installation efficiency, prevent coating failure and improve the process efficiency.

Alternatively, the first positioning part 126 includes two positioning holes located at different positions of the shielding component 120 (i.e., the first shielding component 121 or the second shielding component 122), such as peripheral positions or intermediate positions. The second positioning part 1620 includes a positioning post, and the number of the second positioning part 1620 is the same as that of the first positioning part 126. The second positioning part 1620 are detachably fixed to the first positioning part 126 to realize positioning and installation.

Further, the second body 112 has at least one third positioning part 1123, and the second shielding component 122 further has a fourth positioning part 1223. A position of the third positioning part 1123 corresponds to a position of the fourth positioning part 1223, and the third positioning part 1123 and the fourth positioning part 1223 are cooperatively fixed, so that the second shielding component 122 exactly fits flush against the second body 112, and is just located on the inner wall of the installing chamber 1102, so as to facilitate the rapid installation of the second shielding component 122 in the installing chamber 1102 of the second body 112, so that the substrate 1600 can be quickly positioned and installed in the second body 112 to prevent dislocation.

Alternatively, the third positioning part 1123 includes at least two positioning posts located at different positions of the second body 112 at intervals, such as peripheral positions or middle positions. The fourth positioning part 1223 includes a positioning hole, and the number is the same as the third positioning part 1123, and the third positioning part 1123 is detachably fixed to the fourth positioning part 1223 to achieve positioning and installation.

Alternatively, the first body 111 further has at least a first positioning hole 1112, and the second body 112 further includes at least one first positioning post 1122. A position of the first positioning hole 1112 corresponds to a position of the first positioning column 1122, and the number of the first positioning hole 1112 and the first positioning column 1122 is consistent, so that the first positioning hole 1112 can be cooperatively positioned with the first positioning post 1122, thereby enabling the first body 111 to be fitted to the second body 112 to realize the rapid installation of the first body 111 and the second body 112.

Further, the first body 111 can be positioned and installed on the second body 112 by the fixing part 130 so as to clamp and fix the substrate 1600 to prevent dislocation. Of course, the positioning and installation between the first body 111 and the first shielding part 121 may also be achieved by providing a positioning member, which is not limited here.

Alternatively, the first shielding component 121 can be pre-positioned and fixed, such as bonded to the first body 111, and the second shielding component 122 can be pre-positioned and fixed, such as bonded or clamped to the second body 112. During coating, only the substrate 1600 needs to be positioned and installed between the first body 111 and the second body 112, and corresponding electronic component 1610 can be shielded by the first shielding component 121 and the second shielding component 122 respectively, so as to reduce the installation steps and improve the installation rate.

It can be understood that the inner wall of the installing chamber 1102 may be a concave structure, and the shape and size of the concave structure just match the shape and size of the second shielding component 122 and the first shielding component 121. The inner wall of the installing chamber 1102 further plays the role of positioning and fixing the second shielding component 122 and the first shielding component 121, that is, the shape of the installing chamber 1102 matches the shape of the shielding component 120. The inner wall of the installing chamber 1102 can also play the role of positioning the shielding component 120. It can be understood that the coating chucking appliance 1100 can quickly position and install the substrate 1600, which is simple to operate, has low technical requirements for workers, needs only positioning and mounting, unifies standards and improves production efficiency.

Alternatively, the chucking body 110 has three installing chambers 1102 for installing three substrates 1600 respectively, so as to realize simultaneous coating of three substrates 1600, thereby improving the production efficiency. Of course, the number of the installing chambers 1102 can also be two, four, five, six or even more, which is not limited here.

It can be understood that the shape and structure of the three substrates 1600 can be different, and the shape and size of the first installing chamber 11021, the second installing chamber 11022 and the third installing chamber 11023 correspond to the shape and size of corresponding substrate 1600 respectively. Accordingly, the shielding component 120 also include three shielding components, the electronic components 1610 of the three substrates 1600 are shielded by corresponding shielding component 120, and each shielding component 120 and the corresponding substrate 1600 are clamped and fixed by the first body 111 and the second body 112 of the same chucking body 110. Due to an increase in the number of the substrates 1600, in order to ensure that the substrates 1600 are evenly stressed when clamped by the chucking body 110, the fastening components 130 include six fastening components, wherein four fastening components 130 are respectively arranged at four corners of the chucking body 110, and the other two fastening components 130 are respectively arranged on the chucking body 110 and correspond to the diagonal position of the substrate 1600 in the middle, so as to ensure the uniform stress on the substrate 1600 in the middle.

It should be noted that the coating chucking appliance 1100 may have a flat structure, such as a plate structure, and has unified specification, so as to be placed in large quantities in the installing chamber 1510 of the coating equipment 1500. Further, a support can be placed in the installing chamber 510 of the coating equipment 1500, and the coating chucking appliance 1100 can be placed on the support sequentially and in large quantities. The coating chucking appliance 1100 can be placed on the support in the way that the substrate 1600 is uniformly coated, so as to ensure that the substrate 1600 can be uniformly coated. Further, the support is rotatably installed in the installing chamber 1510, and the support drives the coating chucking appliance 1100 to rotate evenly, so that each substrate 1600 rotates evenly in the installing chamber 1510, so as to ensure that each substrate 1600 is coated evenly, thereby meeting the unified coating demand.

It should be noted that the coating method of the present disclosure can be applied to a coating process of a main board or an auxiliary board of a variety of mobile phone projects in the market, and has been verified in mass production. In addition, the market repair rate of damage of the main board or the auxiliary board of the mobile phone caused by the coating quality or water inflow is greatly reduced, and the market adaptability is good.

FIGS. 10 to 18 show a coating chucking appliance 2100 according to some embodiment of the present disclosure. The coating chucking appliance 2100 is used to assist at least one substrate 2600 to complete the coating process. Specifically, the coating chucking appliance 2100 is used to shield at least one electronic component 2610 not requiring coating on the surface of the substrate 2600, so as to meet the coating requirements of the substrate 2600 and realize mass production. Before coating, the substrate 2600 is installed to the coating chucking appliance 2100, the coating chucking appliance 2100 shields the electronic component 2610 not requiring coating, and the coating chucking appliance 2100 and the substrate 2600 are placed in a coating equipment for coating. During the coating process, the shielded electronic component 2610 on the surface of the substrate 2600 cannot be coated or partially coated, while the unshielded electronic component 2610 and the exposed surface of the substrate 2600 are normally coated or coated with a thin film or nano film. After the coating, the substrate 2600 is disassembled and separated from the coating chucking appliance 2100, and the coating is completed. In addition, in the next coating or coating another substrate 2600, another substrate 2600 can be reinstalled on the coating chucking appliance 2100 to complete the coating, that is, the coating chucking appliance 2100 can be reused and recycled, so as to reduce the cost.

It can be understood that the coating equipment may be a vacuum coating equipment, and the coating equipment provides a chamber with high vacuum, that is, the chamber is not absolute vacuum. The coating chucking appliance 2100 and the substrate 2600 are put into the chamber to complete coating after assembly. Alternatively, the coating type of the coating equipment can be vacuum ion evaporation, magnetron sputtering, MBE molecular beam epitaxy, PLD laser sputtering deposition, physical vapor deposition or plasma chemical vapor deposition, and its working principle is not described here. Alternatively, the coating can be implemented as an organosilicon nano protective film layer, an organosilicon hard nano protective film layer, a composite structure high insulation hard nano protective film layer, a high insulation nano protective film layer with a modulation structure, a plasma polymerization film layer, a gradient increasing structure liquid-proof film layer, a gradient decreasing structure liquid-proof film layer, a film layer with a controllable crosslinking degree, a water-proof and electric breakdown-resistant film layer, a low adhesion and corrosion-resistant film layer, a liquid-proof film layer with a multilayer structure, a polyurethane nano film layer, an acrylamide nano film layer, an anti-static and liquid-proof nano film layer, an epoxy nano film layer, a high transparency and low color difference nano film layer, a high adhesion aging-resistant nano film layer, a silicon-containing copolymer nano film layer or a polyimide nano film layer, etc. Accordingly, the coating equipment can be implemented to coat any one or more of above coatings on the surface of the substrate 2600 to improve the surface properties of the substrate 2600, which is not limited here.

Figure 11:
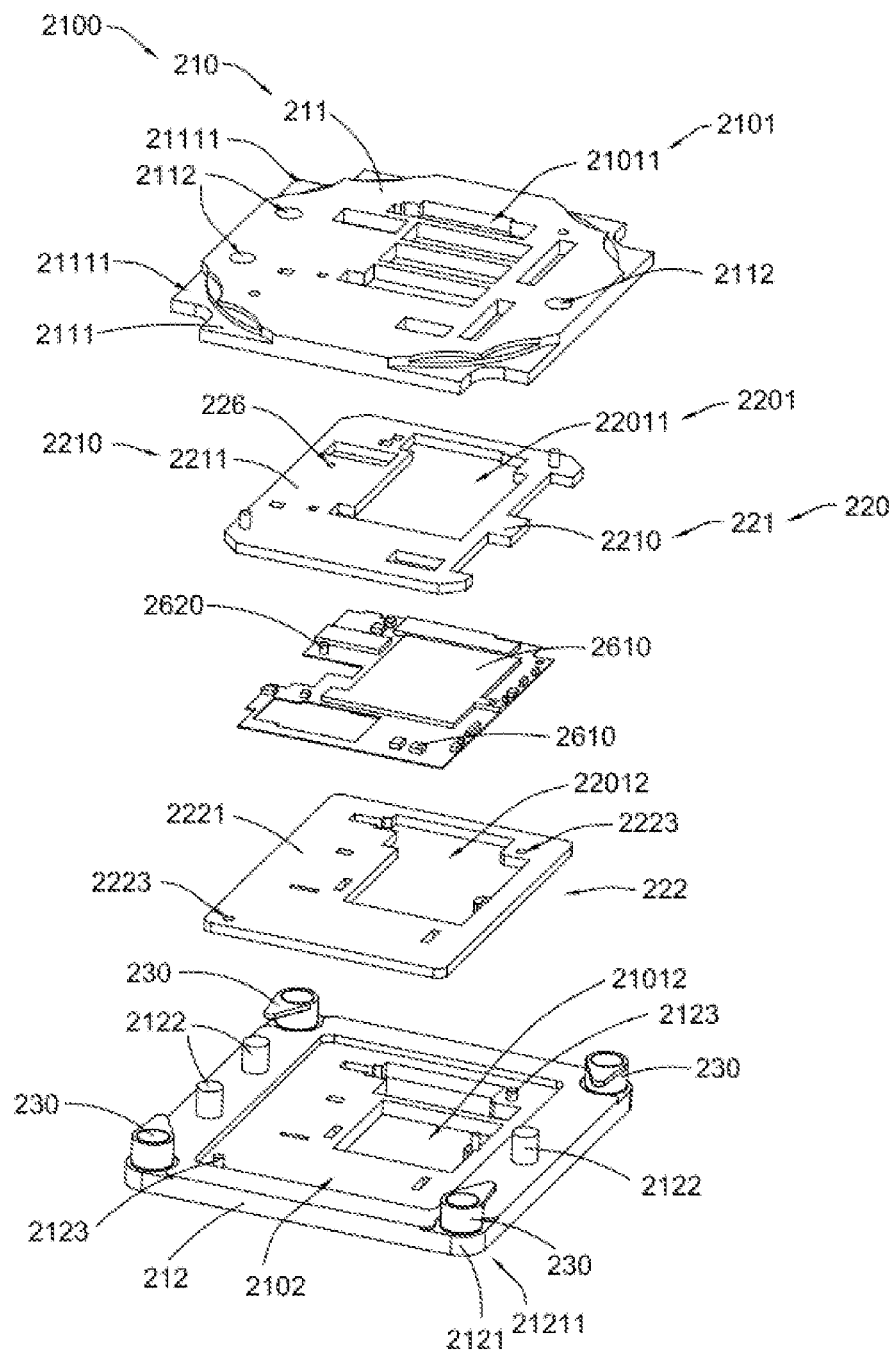
FIG. 11 is an exploded schematic view of the coating chucking appliance according to an embodiment of the present disclosure.

As shown in FIG. 11, the coating chucking appliance 2100 includes a chucking body 210 and at least one shielding component 220, and the shielding component 220 is arranged on the chucking body 210. The substrate 2600 is fixedly held on the chucking body 210, and the shielding component 220 appropriately shields the electronic component 2610 to be coated or partially coated on the surface of the substrate 2600. The chucking body 210 has at least one exposed hole 2101, and the exposed hole 2101 is communicated to the outside. A part or the electronic component 2610 to be coated on the surface of the substrate 2600 is exposed to the exposed hole 2101 to perform coating, so as to meet the shielding requirements of all electronic components 2610 on the surface of the substrate 2600 when the substrate 2600 is coated.

Specifically, the chucking body 210 has at least one installing chamber 2102. The shielding component 220 is arranged on an inner wall 21021 of the installing chamber 2102 of the chucking body 210, and the substrate 2600 is suitable to be detachably installed in the installing chamber 2102. The shape and position of the shielding component 220 match the shape of the substrate 2600 and the position of the electronic component 2610 on the surface of the substrate 2600, so that the shielding component 220 just shields the electronic component 2610 to be coated or partial coated on the surface of the substrate 2600. The exposed hole 2101 is communicated with the installing chamber 2102 so that the part or the electronic component 2610 on the surface of the substrate 2600 that is not shielded by the shielding component 220 and the chucking body 210 can be exposed to the exposed hole 2101, so as to be exposed to the outside and realize the coating demand.

More specifically, the chucking body 210 includes a first body 211 and a second body 212, and the first body 211 and the second body 212 are openably installed together, such as by a clamp connection. The installing chamber 2102 is formed between the first body 211 and the second body 212 to facilitate the installation of the substrate 2600. Both sides of the chucking body 210 are provided with the exposed hole 2101. Specifically, the exposed hole 2101 includes at least one first exposed hole 21011 and at least one second exposed hole 21012, the first exposed hole 21011 is opened in the first body 211 and communicated with the installing chamber 2102, and the second exposed hole 21012 is opened in the second body 212 and communicated with the installing chamber 2102. Therefore, after the substrate 2600 is installed in the installing chamber 2102 of the chucking body 210, a part on one side of the substrate 2600 is exposed to the first exposed hole 21011 and a part on the other side is exposed to the second exposed hole 21012, so that the exposed parts on both sides of the substrate 2600 can be coated or coated at the same time.

Accordingly, the shielding component 220 includes at least one first shielding component 221 and at least one second shielding component 222. The first shielding component 221 is arranged between the first body 211 and one side of the substrate 2600 and is used to correspondingly shield the electronic component 2610 not to be coated on a surface of a side of the substrate 2600. The second shielding component 222 is arranged between the second body 212 and the other side of the substrate 2600 and is used to correspondingly shield the electronic component 2610 not to be coated on a surface of another side of the substrate 2600, so as to meet the requirements of simultaneous coating on both sides of the substrate 2600, and ensure that the electronic component 2610 not to be coated on the surfaces of both sides of the substrate 2600 cannot be coated with the coating.

It should be noted that the first shielding component 221 and the second shielding component 222 can cooperatively shield the same electronic component 2610 on the surface of the substrate 2600, such as the electronic component 2610 on the side of the substrate 2600, which is not limited here.

Alternatively, the chucking body 210 may also be provided with the exposed hole 2101 only on one side, so that the corresponding side of the substrate 2600 can be coated, which is suitable for the case where the substrate 2600 is coated only on one side. Alternatively, after the side of the substrate 2600 is coated, the substrate 2600 is reversely installed in the installing chamber 2102 of the chucking body 210 and coated again, so that the other side of the substrate 2600 is also coated, so as to meet the demand of coating the substrate 2600 on both sides.

Alternatively, when only one side surface of the substrate 2600 has the electronic component 2610 not to be coated, the first shielding component 221 is arranged between the first body 211 and the side of the substrate 2600 and used to shield the electronic component 2610 not to be coated on the surface of the side of the substrate 2600, while the second shielding component 222 may not be arranged between the second body 211 and the other side of the substrate 2600, or the second shielding component 222 does not shield the part or the electronic component to be coated on the surface of the other side of the substrate 2600, so as to meet the coating requirements of the substrate 2600.

In some embodiments, the first body 211 and the second body 212 of the chucking body 210 are made of a hard material, such as a metal material. The first body 211 and the second body 212 have strong hardness and are not easy to bend and deform. The first body 211 and the second body 212 are clamped and fixed with each other. The substrate 2600 is positioned in the installing chamber 2102 between the first body 211 and the second body 212, so as to protect the substrate 2600 from being bent and damaged, and prevent the substrate 2600 from being deformed or damaged under the impact of the external force.

In some embodiments, the first shielding component 221 and the second shielding component 222 of the shielding component 220 are made of a flexible material, such as a silica gel material. The first shielding component 221 and the second shielding component 222 are respectively arranged on both sides of the substrate 2600 and clamped and fixed by the first body 211 and the second body 212 of the chucking body 210, so as to buffer and protect the substrate 2600. At the same time, the relative stability of the substrate 2600 during coating is maintained, the relative deviation or shaking of the substrate 2600 during coating is prevented, and the substrate 2600 is not easy to be damaged, so as to ensure the reliability of coating. That is, the first shielding component 221 further plays a buffer protection role between the first body 211 and the substrate 2600, and the second shielding component 222 further plays a buffer protection role between the second body 212 and the substrate 2600. That is, the first shielding component 221 and the second shielding component 222 play a shielding role on both sides of the substrate 2600 while protecting the substrate 2600 from being damaged.

It should be noted that the first shielding component 221 and the second shielding component 222 of the shielding component 220 are respectively flush against with the surface of the substrate 2600 smoothly. The first body 211 of the chucking body 210 is flush against the first shielding component 221 smoothly, and the second body 212 is flush against the second shielding component 222 smoothly, so as to ensure the uniform stress of the substrate 2600 and prevent stress concentration. Thus, the substrate 2600 is prevented from being bent or damaged. Further, the surfaces on both sides of the chucking body 210 are flat, so that the chucking body 210 can be kept stable when placed in the vacuum coating chamber of the coating equipment, and ensure that the substrate 2600 is stable and not easily shaken to affect coating.

It can be seen that the chucking body 210 and the shield 220 of the coating chucking appliance 210 can be disassembled and installed repeatedly, so that a plurality of substrates 2600 can be installed on the coating chucking appliance 210 circularly, and coating can be realized without replacing a new sticking paper every time, and will not affect the performance of the electronic component 2610 after coating, which can save cost, improve production efficiency, meet the needs of mass production, and have low cost, high durability and recyclability.

As an example, the substrate 2600 may be a PCB circuit board, and the substrate 2600 has a plate-shaped structure. The electronic component 2610 is arranged on the surface of the substrate 2600, and the coating chucking appliance 2100 is adapted to the substrate 2600, that is, the shape and size of the substrate 2600 matches the shape and size of the installing chamber 2102, so that the substrate 2600 is fixedly installed in the installing chamber 2102 of the coating chucking appliance 2100, and the part or the electronic component not to be coated on the surface of the substrate 2600 is shielded by the shielding component 220 or the chucking body 210, while the part or the electronic component to be coated on the surface of the substrate 2600 are exposed to the exposed hole 2101 to meet the coating requirements.

It will be appreciated by those skilled in the art that the substrate 2600 can also be implemented as products to be coated with other shapes and structures, such as mobile phones, electronic devices, electronic device housings, keyboard films or other types of products to be coated, which are not limited here. Accordingly, the shape and structure of the coating chucking appliance 2100 can just adapt to the shape and structure of the substrate 2600, so that the substrate 2600 can just be fixedly installed in the installing chamber 2102 of the coating chucking appliance 2100, and the part to be coated is shielded by the shielding component 220, so as to realize the coating demand That is, the coating chucking appliance 2100 can be customized according to the structural dimensions of different types of the substrate 2600 to meet the market demands.

Further, the electronic component 2610 on the surface of the substrate 2600 is selected from one or more combinations of at least one electronic component 2611 to be coated, at least one electronic component 2612 not to be coated, at least one electronic component 2613 to be partially coated and at least one thin film coating electronic component 2614.

Alternatively, the electronic component 2611 to be coated includes, but is not limited to, a circuit, a solder joint, a housing. During coating, the electronic component 2611 to be coated is not covered and completely exposed so as to realize coating. The electronic component 2612 not to be coated includes, but is not limited to, an antenna elastic strip, an optical device such as a distance sensor, a camera module, ab acoustic device. During coating, the electronic component 2612 not to be coated is blocked by the shielding component 220 and cannot be coated. The electronic component 2613 to be partially coated has at least one to-be-coated part 26131 and at least one non-coating part 26132, the to-be-coated part 26131 is not shielded, and the non-coating part 26132 is shielded by the shielding component 220, so as to meet partial coating requirements. The thin film coating electronic component 2614 includes, but is not limited to, a circuit interface component, such as USB interface, and a coating gap D1 with a certain spacing is maintained between the thin film coating electronic component 2614 and the shielding component 220. During coating, the position where the thin film coating electronic component 2614 is completely exposed relative to the substrate 2600, such as the electronic component 2611 to be coated, is coated with a thinner coating to meet the coating requirements.

Figure 12:
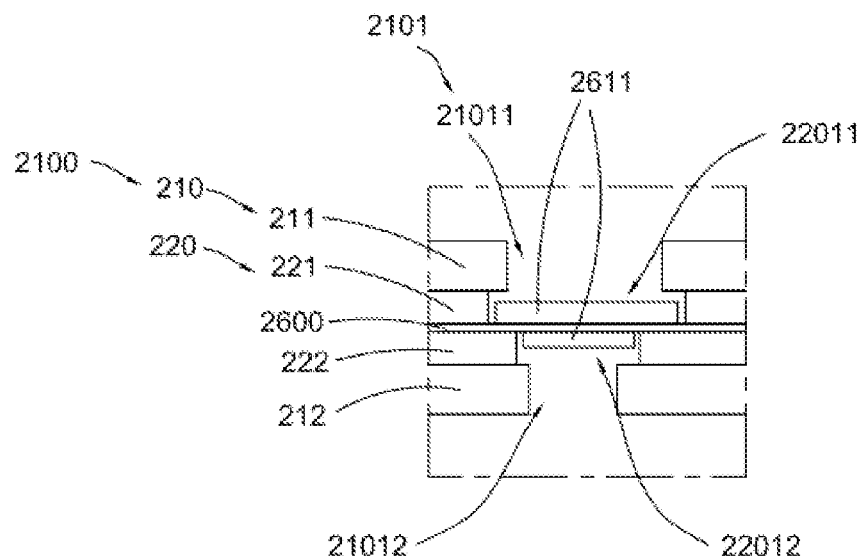
FIG. 12 is a partial cross-sectional schematic view showing that the coating chucking appliance does not shield an electronic component to be coated on the substrate according to an embodiment of the present disclosure.
Figure 13:
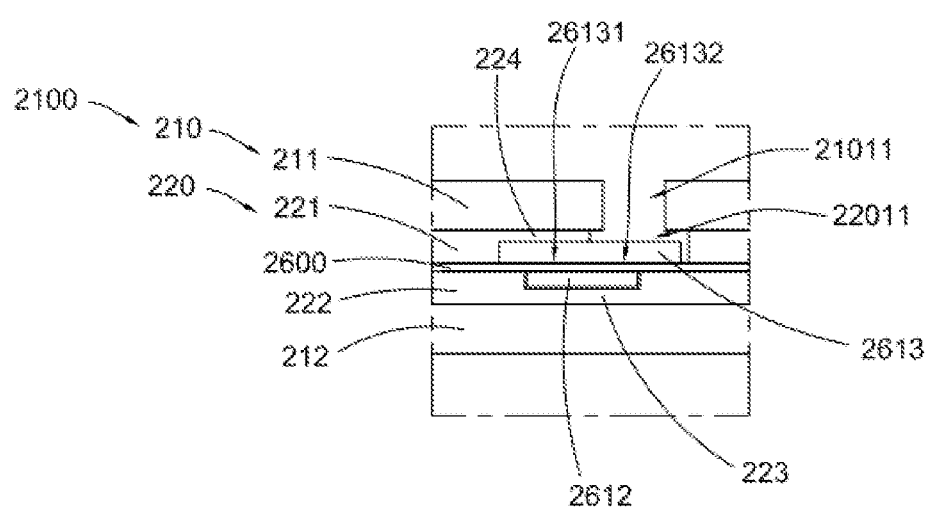
FIG. 13 is a partial cross-sectional schematic view showing that the coating chucking appliance shields an electronic component not to be coated on the substrate according to an embodiment of the present disclosure.
Figure 14:
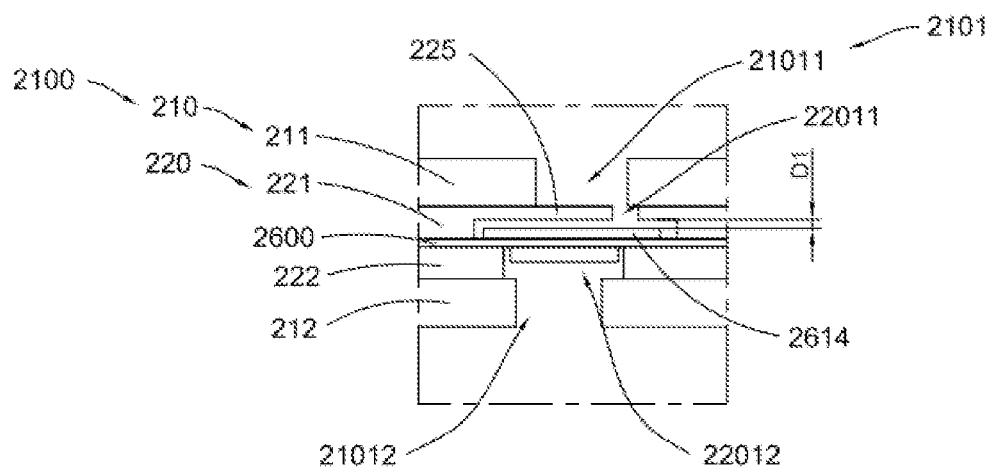
FIG. 14 is a partial cross-sectional schematic view showing that the coating chucking appliance has a certain distance from the electronic component to be coated with a thinner coating on the substrate according to an embodiment of the present disclosure.

As shown in FIGS. 12 to 14, in some embodiments, the shielding component 220 has at least one through hole 2201, and the through hole 2201 includes at least one first through hole 22011 and at least one second through hole 22012. The first through hole 22011 is arranged on the first shielding component 221, and the second through hole 22012 is arranged on the second shielding component 222. During coating, the first through hole 22011 communicates with the installing chamber 2102 and the first exposed hole 21011, the second through hole 22012 communicates with the installing chamber 2102 and the second exposed hole 21012, and the electronic components 2611 to be coated on both sides of the surface of the substrate 2600 are exposed to the first through hole 22011 and the second through hole 22012 respectively. Thus, the electronic components 2611 to be coated are exposed to the exposed hole 2101 to meet the coating requirements.

It should be noted that the shape and size of the first through hole 22011, the second through hole 22012, the first exposed hole 21011 and the second exposed hole 21021 can be preset according to the shape and size of the substrate 2600 and the area to be coated, so as to meet the actual coating requirements.

In some embodiments, the shielding component 220 includes at least one shielding body 2210, and the shielding body 2210 may include at least one first shielding body 2211 and at least one second shielding body 2212. The first shielding component 221 includes the first shielding body 2211, and the second shielding component 222 includes the second shielding body 2212. The first shielding component 221 and the second shielding component 222 of the shielding component 220 further include one or more combinations selected from a group consisting of at least one complete shielding part 223, at least a partial shielding part 224 and at least one suspended shielding part 225, respectively. The complete shielding part 223 appropriately covers or wraps the electronic component 2612 not to be coated to achieve complete shielding, the partial shielding part 224 appropriately covers or wraps the non-coating part 26132 of the electronic component 2613 to be partially coated to achieve partial shielding, and the suspended shielding part 225 maintains the coating gap D1 from the thin film coating electronic component 2614 to achieve suspended shielding.

It can be understood that for different types of the substrate 2600, the shielding component 220 can be preset to have a combination of one or more of the complete shielding part 223, the partial shielding part 224 and the suspended shielding part 225. Alternatively, if the substrate 2600 includes only the electronic component 2612 not to be coated and the electronic component 2611 to be coated, the shielding component 220 is preset to have the complete shielding part 223, and may or may not have the partial shielding part 224 and the suspended shielding part 225. That is, the structure of the shielding component 220 can be preset according to the type and model of the substrate 2600, which is not limited here.

In some embodiments, the complete shielding part 223, the partial shielding part 224 and the suspended shielding part 225 are integrally connected, wherein the complete shielding part 223 of the shielding component 220 corresponds to the position of the electronic component 2612 not to be coated on the substrate 2600, the partial shielding part 224 corresponds to the position of the non-coating part 26132 of the electronic component 2613 to be partially coated on the substrate 2600, and the suspended shielding part 225 corresponds to the position of the thin film coating electronic component 2614 on the substrate 2600. That is, the shielding component 220 of the coating chucking appliance 2100 can shield a plurality of electronic components 2610 not to be coated at the same time, while the other electronic components 2610 to be coated are not shielded, so as to meet the coating requirements.

Specifically, the first shielding component 221 has the first shielding body 2211, and the first shielding body 2211 forms the first through hole 22011. The complete shielding part 223, the partial shielding part 224 and the suspended shielding part 225 are integrally formed on the first shielding body 2211. The second shielding component 222 has the second shielding body 2221, and the second shielding body 2221 forms the second through hole 22012. The complete shielding part 223, the partial shielding part 224 and the suspended shielding part 225 are integrally formed on the second shielding body 2221.

That is, when the substrate 2600 is installed in the installing chamber 2102 of the coating chucking appliance 2100, the complete shielding part 223 correspondingly covers or wraps the electronic component 2612 not to be coated, the partial shielding part 224 correspondingly wraps or covers the non-coating part 26132 of the electronic component 2613 to be partially coated, and the suspended shielding part 225 correspondingly maintains the coating gap D1 from the thin film coating electronic component 2614.

During coating, since the electronic component 2611 to be coated and the to-be-coated part 26131 of the electronic component 2613 to be partially coated are not shielded by the shielding component 220, a certain amount of plasma will be deposited on the electronic component 2611 to be coated and the to-be-coated part 26131 of the electronic component 2613 to be partially coated to form a certain thickness of coating. The non-coating part 26132 of the electronic component 2612 and the electronic component 2613 not to be coated are blocked, thus plasma cannot be deposited, so that the coating cannot be formed on the surface. The suspended shielding part 225 is suspended above the upper side of the thin film coating electronic component 2614 and has the coating gap D1 with a certain distance from the thin film coating electronic component 2614, so that the suspended shielding part 225 will reduce the rate of plasma deposition on the surface of the thin film coating electronic component 2614, resulting in the reduction of the thickness of the coating on the surface of the thin film coating electronic component 2614, and according to the preset spacing size of the coating gap, the coating of film layers with different thicknesses can be realized.

It should be noted that by presetting the height of the coating gap D, the deposition rate of the plasma deposited on the surface of the thin film coating electronic component 2614 is changed accordingly, so that the surface of the thin film coating electronic component 2614 is coated with a coating of a preset thickness. Accordingly, for a plurality of thin film coating electronic components 2614, corresponding coating gap D between each thin film coating electronic component 2614 and the plurality of suspended shielding parts 225 of the shielding component 220 can be preset respectively, so that the coating equipment can meet the coating requirements of different thicknesses of the plurality of electronic components 2610 on the surface of the substrate 2600 through one coating, which can reduce the number of coating times, save manpower and time, improve coating efficiency and prolong the service life of coating equipment.

Alternatively, the complete shielding part 223, the partial shielding part 224 and the suspended shielding part 225 can be arranged between the chucking body 210 and the substrate 2600 independently of each other. The complete shielding part 223 corresponds to the position of the electronic component 2612 not to be coated on the substrate 2600, the partial shielding part 224 corresponds to the position of the non-coating part 26132 of the electronic component 2613 to be partially coated on the substrate 2600, and the suspended shielding part 225 corresponds to the position of the thin film coating electronic component 2614 on the substrate 2600.

Figure 15:
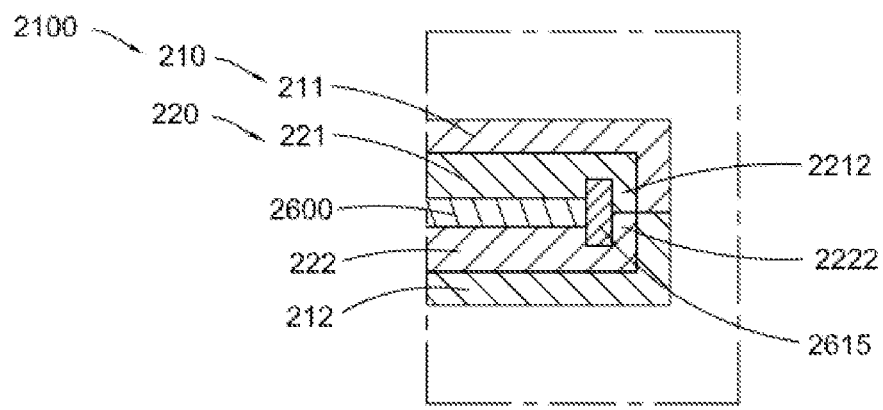
FIG. 15 is a partial cross-sectional schematic view showing that the coating chucking appliance shields a common shielded electronic component on the substrate according to an embodiment of the present disclosure.

As shown in FIG. 15, alternatively, the first shielding component 221 and the second shielding component 222 can shield the same electronic component 2610 on the substrate 2600. Specifically, the substrate 2600 has at least one common shielded electronic component 2615. The common shielded electronic component 2615 is located at the side or hole edge of the substrate 2600, and the common shielded electronic component 2615 may be a USB interface or a socket. The first shielding component 221 has at least one first shielding part 2212, and the second shielding component has at least one second shielding part 2222. The first shielding part 2212 is located on the side or hole edge of the first shielding body 2211 of the first shielding component 221 and just corresponds to the position of the common shielded electronic component 2615, and the second shielding part 2222 is located on the side or hole edge of the second shielding body 2221 of the second shielding component 222 and just corresponds to the position of the common shielded electronic component 2615. The first shielding part 2212 and the second shielding part 2222 cover or wrap the common shielded electronic component 2615, so that the common shielded electronic component 2615 cannot be coated. In other words, during shielding, the first shielding part 2212 and the second shielding part 2222 correspondingly overlap to cover the common shielded electronic component 2615, that is, a combined area of the first shielding part 2212 and the second shielding part 2222 is greater than or equal to a non-coating area of the common shielded electronic component 2615, so as to realize shielding and meet the coating requirements.

It can be understood that the shape structures of the complete shielding part 223, the partial shielding part 224 and the suspended shielding part 225 can be implemented to shield a corresponding shape structure of the electronic component 2610, such as a groove structure, a convex structure, a plane structure, an arc structure or an irregular shape structure, which is not limited here.

Further, the structural size of the chucking body 210 can be preset. Specifically, the height and shape of the installing chamber 2102 can be preset, and the shape, size and thickness of the shielding component 220 can be preset, so that the substrate 2600 with different thickness or size can be fitted to the installing chamber 2102 and kept fixed, thus the coating chucking appliance 2100 can be suitable for the coating requirements of substrates with different thicknesses or sizes.

In some embodiments, the coating chucking appliance 2100 also includes a set of fastening components 230, and the fastening components 230 are fixedly installed on the chucking body 210. Specifically, the fastening components 230 are fixedly installed between the first body 211 and the second body 212, and the fastening components 230 can switch between a fastening state and a disassembling state. In the fastening state, the height of the installing chamber 2102 is reduced, and the fastening components 230 provide a force to keep the first body 211 and the second body 212 relatively fixed for clamping and fixing the substrate 2600 in the installing chamber 2102. In the disassembling state, the installing chamber is opened, and the force is removed, thus the first body 211 and the second body 212 can be separated from each other, so as to disassemble or install the substrate 2600 in the installing chamber 2102.

In some embodiments, the fastening components 230 include at least four fastening components symmetrical to each other. The fastening components 230 are respectively arranged at four corners of the chucking body 210, so that the chucking body 210 can be stressed evenly in the fastening state, so as to ensure the uniform stress of the substrate 2600 and prevent the substrate 2600 from being bent or damaged due to excessive stress concentration.

Further, the first body 211 has at least one first fixing part 2111, the second body 212 has at least one second fixing part 2121, and the first fixing part 2111 and the second fixing part 2121 correspond to each other in position. The fastening components 230 are detachably installed between the first fixing part 2111 and the second fixing part 2121, so as to fix or disassemble the first body 211 and the second body 212.

Figure 16:
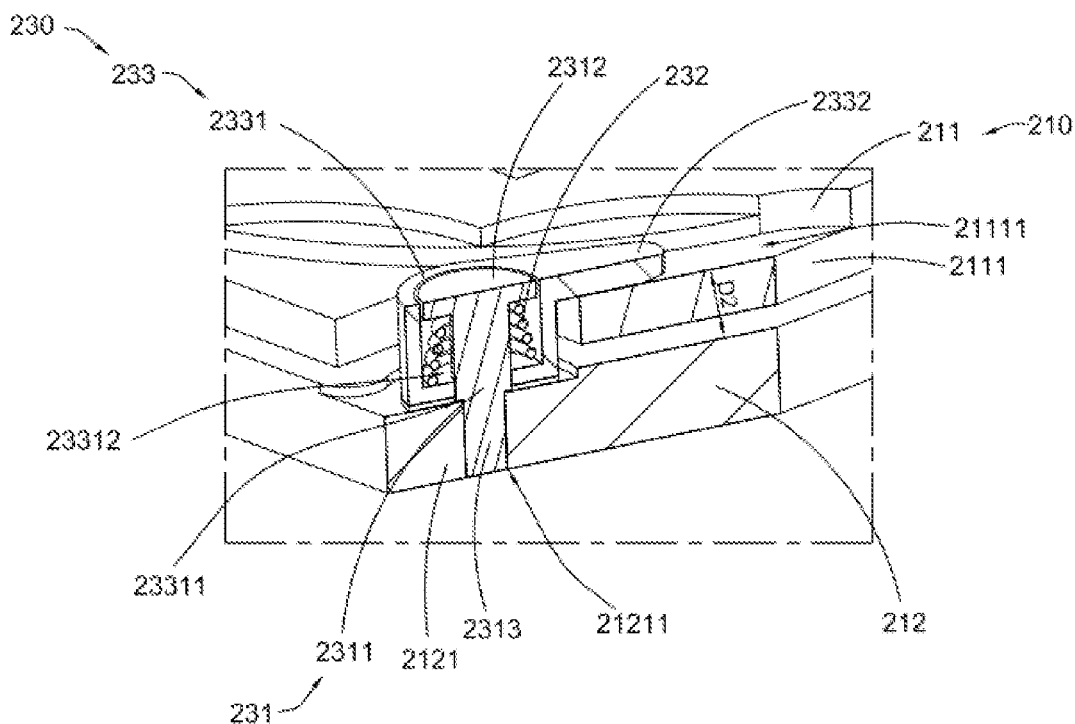
FIG. 16 is a partial cross-sectional schematic view of a fastening component of the coating chucking appliance according to an embodiment of the present disclosure.

As shown in FIG. 16, specifically, the fastening component 230 includes a support part 231, an elastic element 232 and a movable part 233, and the second fixing part 2121 of the second body 212 has a fixing hole 21211. The support part 231 is fixedly installed in the fixing hole 21211, and the movable part 233 is movably installed to the support part 231 and rotates or moves between the fastening state and the disassembling state. In the fastening state, the movable part 233 is rotated to the first fixing part 2111 of the first body 211 so that the first body 211 and the second body 212 are clamped between the support part 231 and the movable part 233. In the disassembling state, the movable part 231 is removed from the first fixing part 2111 so that the first body 211 and the second body 212 can be separated from each other. The elastic element 232 is installed between the movable part and the support part 231. When the movable part 233 is rotated to the fastening state, the elastic element 232 provides an elastic force to clamp and hold the first body 211 and the second body 212 between the support part 231 and the movable part 233. When the movable part 233 is rotated to the disassembling state, the force provided by the elastic element 232 is reduced so that the movable part 233 is rotated to the fastening state again.

Further, the support part 231 includes a support post 2311, a support end 2312 and a fixing end 2313. The support end 2312 and the fixing end 2313 are respectively integrally formed at both ends of the support post 2311. The fixing end 2313 is fixed to the second fixing part 2121 of the second body 212, and the support post 2311 passes through the fixing hole 21211. The support end 2312 is separated from the second fixing part 2121 of the second body 212 by a certain distance, and the distance matches the thickness of the first body 211. A horizontal area of the support end 2312 is greater than a radial cross-sectional area of the support post 2311, that is, an axial section of the support part 231 is a T-shaped surface, an umbrella-shaped surface or an I-shaped surface.

Further, the movable part 233 includes a movable body 2331 and a movable arm 2332. The movable arm 2332 extends integrally along the movable body 2331 and has a movable distance D2 from the second fixing part 2121 of the second body 212. The movable body 2331 has a movable hole 23311, and the support post 2311 passes through the movable hole 23311 and allows the movable arm 2332 to rotate between the fastening state and the disassembling state along the support post 2311. The size of the movable hole 23311 is less than the size of the support end 2312 so that the movable body 2331 cannot be separated from the support part 231.

In some embodiments, the elastic element 232 may be a spring, a wave spring, etc., which is made of an elastic material. A movable chamber 23312 is arranged between the movable body 2331 and the support end 2312, and the elastic element 232 is installed in the movable chamber 23312. Both ends of the elastic element 232 are supported on the movable body 2331 and the support end 2312 respectively and provide the elastic force. Further, the first fixing part 2111 of the first body 211 has a movable space 21111, and the movable space 21111 provides a space for the movable arm 2332 to be rotated between the fastening state and the disassembling state. In other words, when the movable arm 2332 is in the disassembling state, the movable arm 2332 will not prevent the first fixing part 2111 of the first body 11 from fitting with the second fixing part 2121 of the second body 212, and the movable space 21111 provides a space for the movable arm 2332 to be rotated to the first fixing part 2111, so that the movable arm 2332 is rotated to the fastening state.

When the movable arm 2332 is rotated to the fastening state, the movable arm 2332 is rotated to the upper side of the first fixing part 2111. The elastic element 232 provides an elastic force to reduce the movable spacing D2, and the movable spacing D2 is basically equal to the thickness of the first fixing part 2111, so that the first fixing part 2111 is clamped and fixed between the movable arm 2332 and the second fixing part 2121, thus the first body 211 and the second body 211 clamps and fixes the substrate 2600 to the installing chamber 2102. When the movable arm 2332 is rotated to the disassembling state, the movable arm 2332 is rotated away from the upper side of the first fixing part 2111, so that the first body 211 and the second body 212 can be disassembled and separated, so as to disassemble the substrate 2600.

That is, when the movable arm 2332 is rotated to the disassembling state, the movable spacing D2 between the movable arm 2332 and the second fixing part 2121 of the second body 212 is greater than the thickness of the first fixing part 2111 of the first body 211, so that the movable arm 2332 can be rotated to the upper side of the first fixing part 2111. When the movable arm 2332 is rotated to the upper side of the first fixing part 2111, the elastic element 232 provides the elastic force to reduce the distance between the movable part 233 and the second fixing part 2121 of the second body 212, so as to reduce the movable spacing D2 until the movable arm 2332 is pressed against the upper surface of the first fixing part 2111 and remains fixed. Thus, the first body 211 and the second body 212 are kept clamped and fixed.

Further, a surface of the first fixing part 2111 of the first main body 211 is an inclined surface. During installation, the inclined surface guides the movable arm 2332 to gradually rotate to the fastening state, and the movable spacing D2 gradually decreases. Conversely, during disassembly, the inclined surface guides the movable arm 2332 to gradually rotate to the disassembling state until the movable arm 2332 is separated from the first fixing part 2111, and the movable spacing D2 increases so as to facilitate manual operation and improve the speed and accuracy of installation and disassembly.

It should be noted that upper surfaces of the movable arm 2332 and the support end 2312 of the fastening component 230 are flat surfaces and basically in the same plane. The first body 211 and the second body 212 also have flat surfaces, so that the coating chucking appliance 2100 can be flatly placed in the coating equipment, so as to facilitate the regular placement of a plurality of coating chucking appliances 2100 in the coating equipment, reduce the occupied space and increase the number of coatings at the same time, and improve the coating efficiency and facilitate mass production.

It should be noted that the height of the installing chamber 2102 can be preset according to the preset height size of the support post 2311 or the movable spacing D2, so as to clamp the substrate 2600 with different thickness and meet wider coating requirements.

Further, the first shielding component 221 and the second shielding component 222 of the shielding component 220 have at least one first positioning part 226 respectively, and the substrate 2600 has at least one second positioning part 2620. A position of the first positioning part 226 corresponds to a position of the second positioning part 2620. The first positioning part 226 and the second positioning part 2620 are adapted to be cooperatively secured such that the shielding component 220 is exactly flush against the substrate 2600. The complete shielding part 223 of the shielding part 220 correspondingly covers or wraps the electronic component 2612 not to be coated, the partial shielding part 224 correspondingly wraps or covers the non-coating part 26132 of the electronic component 2613 to be partially coated, and the suspended shielding part 225 correspondingly maintains the coating gap D1 from the thin film coating electronic component 2614, so that the first shielding component 221 and the second shielding component 222 can be quickly positioned and installed on both sides of the substrate 2600, and realize the shielding demand at the same time, which can prevent dislocation, accelerate the installation efficiency, prevent coating failure and improve the process efficiency.

In some embodiments, the first positioning part 226 includes two positioning holes, and the first positioning parts 226 is located at different positions of the shielding component 220 (i.e., the first shielding component 221 or the second shielding component 222), such as peripheral positions or intermediate positions. The second positioning part 2620 may be a positioning post, and the number of the second positioning part 2620 is the same as that of the first positioning part 226. The second positioning part 2620 is detachably fixed to the first positioning part 226 to realize positioning and installation.

Further, the second body 212 has at least one third positioning part 2123, the second shielding component 222 further has a fourth positioning part 2223, and a position of the third positioning part 2123 corresponds to a position of the fourth positioning part 2223. The third positioning part 2123 and the fourth positioning part 2223 are adapted to be cooperatively secured so that the second shielding component 222 is exactly flush against the second body 212, and is located on the inner wall of the installing chamber 2102, so as to facilitate the rapid installation of the second shielding component 222 in the installing chamber 2102 of the second body 212, so that the substrate 2600 can be quickly positioned and installed to the second body 212 to prevent misalignment.

In some embodiments, the third positioning part 2123 may include at least two positioning posts, which are located at different positions of the second body 212 at intervals, such as peripheral positions or middle positions. The fourth positioning part 2223 may be a positioning hole, and the number of the fourth positioning part 2223 is the same as that of the third positioning part 2123. Each third positioning part 2123 is detachably fixed to the fourth positioning part 2223 to achieve positioning and installation.

In some embodiments, the first body 211 further has at least one first positioning hole 2112, and the second body 212 further includes at least one first positioning post 2122. A position of the first positioning hole 2112 corresponds to a position of the first positioning post 2122, and the number of the first positioning hole 2112 and the first positioning post 2122 are consistent, so that the first positioning hole 2112 can be cooperatively positioned with the first positioning post 2122. Further, the first body 211 can be matingly engaged with the second body 212 to realize the rapid installation of the first body 211 and the second body 212.

Further, the first body 211 can be positioned and installed on the second body 212 by the fastening component 230 while clamping and fixing the substrate 2600 to prevent dislocation. Of course, the positioning and installation between the first body 211 and the first shielding component 221 can also be carried out by setting a positioning part, which is not limited here.

Alternatively, the first shielding component 221 can be pre-positioned and fixed, such as bonded to the first body 211, and the second shielding component 222 can be pre-positioned and fixed, such as bonded or clamped to the second body 212. During coating, only the substrate 2600 needs to be positioned and installed between the first body 211 and the second body 212, and corresponding electronic component 2610 can be shielded by the first shielding component 221 and the second shielding component 222 respectively, so as to reduce the installation steps and improve the installation rate.

It can be understood that the inner wall of the installing chamber 2102 may be a concave structure, and the shape and size just match the shape and size of the second shielding component 222 and the first shielding component 221. The inner wall of the installing chamber 2102 further plays the role of positioning and fixing the second shielding component 222 and the first shielding component 221, that is, the shape of the installing chamber 2102 matches the shape of the shielding component 220. The inner wall of the installing chamber 2102 can also play the role of positioning the shielding component 220. It can be understood that the coating chucking appliance 2100 can quickly position and install the substrate 2600, which is simple to operate and has low technical requirements for workers, needs only positioning and mounting, unifies standards and improves production efficiency.

Figure 17:
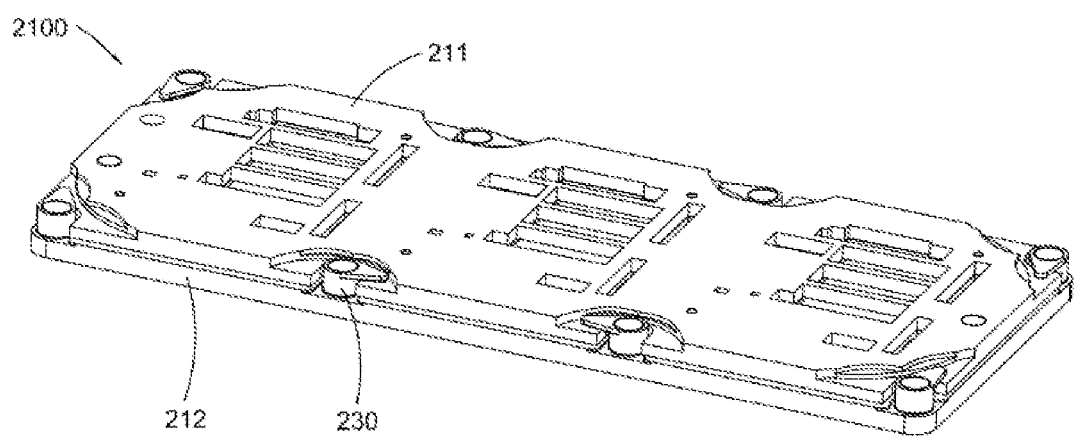
FIG. 17 is a structural schematic view of the coating chucking appliance with three installing chambers according to an embodiment of the present disclosure.
Figure 18:
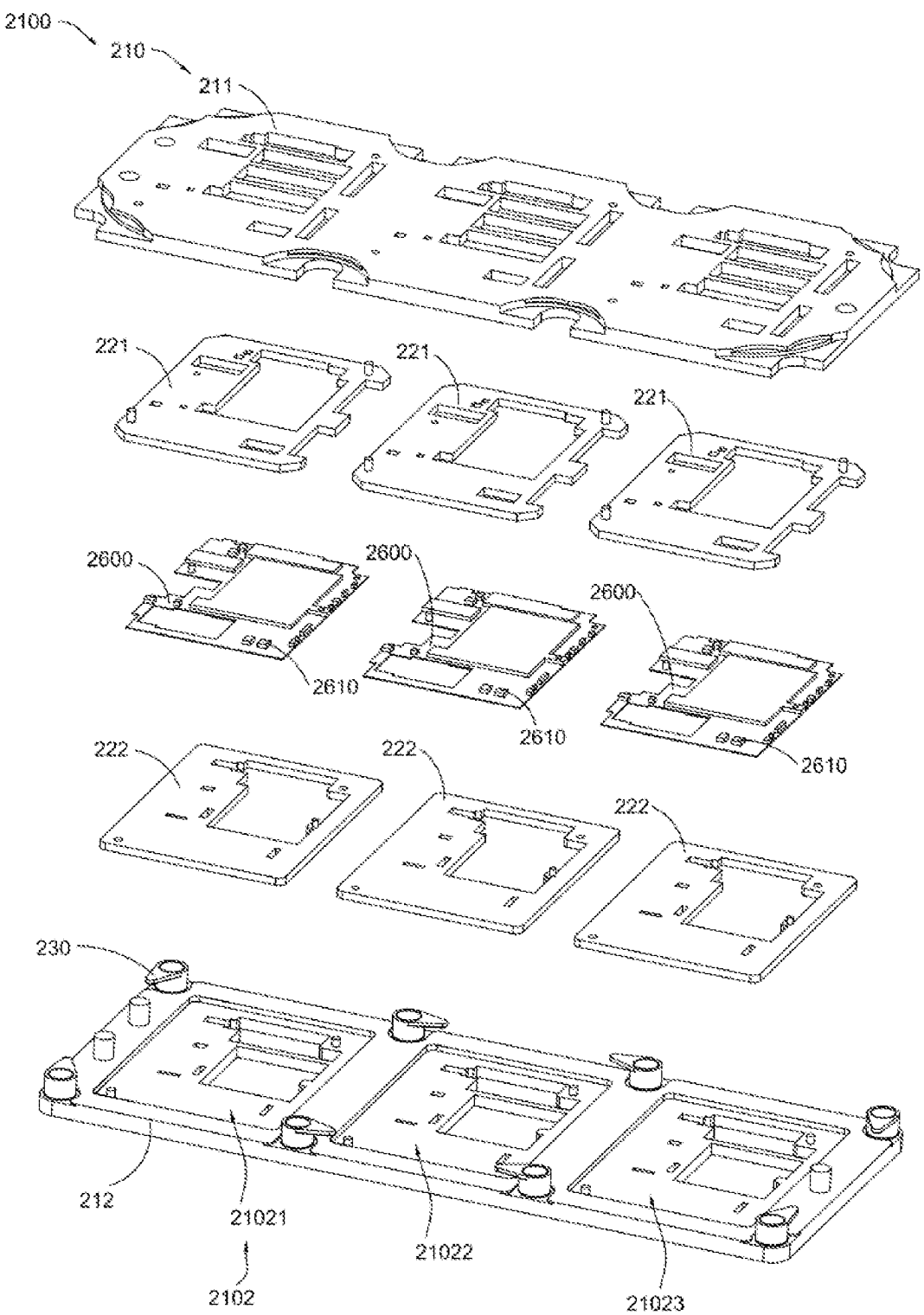
FIG. 18 is an exploded schematic view of the coating chucking appliance with three installing chambers according to an embodiment of the present disclosure.

As shown in FIG. 17 and FIG. 18, in other embodiments, the chucking body 210 has three installing chambers 2102, i.e., a first installing chamber 21021, a second installing chamber 21022 and a third installing chamber 21023. The first installing chamber 21021, the second installing chamber 21022 and the third installing chamber 21023 are suitable for installing the substrate 2600 respectively, thus three substrates 2600 can be coated at the same time, and the corresponding coating requirements of the electronic components 2610 of the substrate 2600 can be met, so as to improve the production efficiency and meet the requirements of industrial mass production. Of course, the number of the installing chambers 2102 can also be two, four, five, six or even more, which is not limited here.

It can be understood that the shape and structure of the three substrates 2600 can be different, and the shape and size of the first installing chamber 21021, the second installing chamber 21022 and the third installing chamber 21023 correspond to the shape and size of corresponding substrate 2600 respectively. Accordingly, the shielding component 220 also includes three shielding components, wherein the electronic components 2610 of the three substrates 2600 are shielded by corresponding shielding component 220, and each shielding component 220 and the corresponding substrates 2600 are clamped and fixed by the first body 211 and the second body 212 of the same chucking body 210. Due to the increase in the number of the substrates 2600, in order to ensure that the substrates 2600 are evenly stressed when clamped by the chucking body 210, the fastening components 230 include six fastening components, wherein four fastening components 230 are respectively arranged at four corners of the chucking body 210, and the other two fastening components 230 are respectively arranged on the chucking body 210 and correspond to the diagonal position of the substrate 2600 in the middle, so as to ensure uniform stress on the substrate 2600 in the middle.

It should be noted that the coating chucking appliance 2100 of the present disclosure can be adapted to the coating process of the main board or auxiliary board of various mobile phone projects in the market, and has been verified in mass production. In addition, the market repair rate of the damage of the main board or auxiliary board of the mobile phone caused by coating quality or water inflow is greatly reduced, and the market adaptability is good.

The present disclosure further provides an installation method of the coating chucking appliance 2100, including the following steps:

S10. installing the shielding component 220 on at least one side of the substrate 2600, wherein the shielding component 220 shields the electronic component 2610 not to be coated on the surface of the substrate 2600; and S20. installing the substrate 2600 in the installing chamber 2102 of the chucking body 210 and exposing the part or the electronic component to be coated on the surface of the substrate 2600.

Further, S10 includes following step: S11. installing the first shielding component 221 and the second shielding component 222 on both sides of the substrate 2600 respectively.

Further, S20 includes following step: S21. installing the second body 212 on the outside of the second shielding component 221 of the shielding component 220; and S22. installing the first body 211 on the second body 212 by fixing the substrate 2600.

Alternatively, the installation method of the coating chucking appliance 2100 may also be implemented to include following steps:

S01. fixing the shielding component 220 on the inner wall of the installing chamber 2102 of the chucking body 210; and S02. installing the substrate 2600 in the installing chamber 2102 of the chucking body 210, wherein the shielding component 220 shields the electronic component 2610 not to be coated on the surface of the substrate 2600, and exposes the part to be coated on the surface of the substrate 2600.

It will be appreciated by those skilled in the art that the embodiments of the present disclosure described above and shown in the accompanying drawings are illustrative only and do not limit the present disclosure. The advantages of the present disclosure have been completely and effectively realized. The function and structural principle of the present disclosure have been shown and explained in the embodiments, and any variations or modifications of the embodiments of the present disclosure are possible without departing from the principles described.

The invention claimed is:

1. A coating chucking appliance, comprising: a chucking body; and at least one shielding component configured on the chucking body; wherein the chucking body has at least one installing chamber for installing at least one substrate, and a position of the shielding component corresponds to a position of at least one electronic component on a surface of the substrate; wherein after installation, the shielding component correspondingly shields the electronic component on the surface of the substrate to meet a shielding requirement of the electronic component on the surface of the substrate when coating the substrate wherein the shielding component comprises at least one suspended shielding part, and a position of the suspended shielding part corresponds to a position of a thin coating electronic component on the substrate and the suspended shielding part maintains a coating gap relative to the thin coating electronic component to achieve a suspended shielding, wherein the substrate is installed to the coating chucking appliance to form a thick film layer and a thin film layer simultaneously.

2. The coating chucking appliance according to claim 1, wherein the chucking body comprises a first body and a second body which are openably installed together, and the installing chamber is formed between the first body and the second body, wherein the shielding component is configured on an inner wall of the installing chamber, and the chucking body has at least one exposed hole communicated with the installing chamber.

3. The coating chucking appliance according to claim 2, wherein the shielding component comprises at least one first shielding component and at least one second shielding component, the first shielding component is configured on the first body for shielding the electronic component on one side of the substrate, and the second shielding component is configured on the second body for shielding the electronic component on the other side of the substrate.

4. The coating chucking appliance according to claim 2, wherein the shielding component is configured on the first body for shielding the electronic component on one side of the substrate, while the other side of the substrate is not shielded.

5. The coating chucking appliance according to claim 3, wherein both the first shielding component and the second shielding component are made of a flexible material.

6. The coating chucking appliance according to claim 1, wherein the chucking body is made of a hard material and has a flat surface.

7. The coating chucking appliance according to claim 1, wherein the shielding component comprises at least one shielding body and at least one complete shielding part, the shielding body is configured on the chucking body, the complete shielding part is connected with the shielding body, and a position of the complete shielding part corresponds to a position of a non-coating electronic component on the substrate and covers the non-coating electronic component so that the complete shielding part shields the electronic component not to be coated.

8. The coating chucking appliance according to claim 7, wherein the shielding component further comprises at least one partial shielding part connected with the shielding body, and a position of the partial shielding part corresponds to a position of a non-coating part of a partially coating electronic component on the substrate and covers the non-coating part of the partially coating electronic component so that the partial shielding part shields the non-coating part of the partially coating electronic component.

9. The coating chucking appliance according to claim 3, wherein the first shielding component comprises at least one first shielding body, and the at least one first shielding body comprises the at least one suspended shielding part, and the at least one first shielding body further comprises one or more combinations of at least one complete shielding part, and at least one partial shielding part.

10. The coating chucking appliance according to claim 9, wherein the first shielding component further comprises at least one first shielding part connected to the first shielding body, the second shielding component comprises a second shielding body and at least one second shielding part connected with the second shielding body, and the first shielding part and the second shielding part cooperatively correspond to a position of a common shielded electronic component on the substrate and cooperatively cover the common shielded electronic component.

11. The coating chucking appliance according to claim 1, wherein the shielding component comprises at least one first positioning part, a position of the at least one first positioning part corresponds to a position of at least one second positioning part of the substrate, and the at least one first positioning part is positioned and fixed with the at least one second positioning part so that the shielding component shields the electronic component on the substrate during installation.

12. The coating chucking appliance according to claim 11, wherein the at least one first positioning part comprises at least two positioning holes, and each first positioning part is configured at different positions of the shielding component at intervals from each other.

13. The coating chucking appliance according to claim 11, wherein the chucking body comprises at least one third positioning part, the shielding component also comprises at least one fourth positioning part, and a position of the at least one third positioning part corresponds to the at least one fourth positioning part, wherein the at least one third positioning part is positioned and fixed with the at least one fourth positioning part so as to realize positioning and installing of the chucking body and the shielding component.

14. The coating chucking appliance according to claim 13, wherein the at least one third positioning part comprises a positioning hole, and the at least one fourth positioning part comprises a positioning post matching with the positioning hole.

15. The coating chucking appliance according to claim 11, wherein the shielding component is installed on an inner wall of the installing chamber, the inner wall of the installing chamber has a concave structure and matches with the shielding component in shape and size, and the inner wall of the installing chamber is adapted to position and fix the shielding component.

16. The coating chucking appliance according claim 2 wherein the coating chucking appliance further comprises a set of fastening components, and the fastening components are fixedly installed on the chucking body and can switch between a fastening state and a disassembling state, wherein in the fastening state, a height of the installing chamber is reduced, and the fastening components provide a force to keep the substrate fixed, and in the disassembling state, the force is removed, and the installing chamber can be opened so that the substrate can be removed.

17. The coating chucking appliance according to claim 16, wherein each of the fastening components comprises a support part, an elastic element and a movable part, wherein the support part is fixedly installed in a fixing hole of a second fixing part of the second body, the movable part is movably installed to the support part and rotates or moves between the fastening state and the disassembling state, and the elastic element is installed between the movable part and the support part.

18. The coating chucking appliance according to claim 17, wherein the support part comprises a support post, a support end and a fixing end, and the support end and the fixing end are respectively integrally formed at both ends of the support post, wherein the fixing end is fixed to the second fixing part of the second body, the support post passes through the fixing hole, and the support end is separated from the second body by a certain distance, and the distance matches a thickness of the first body.

19. The coating chucking appliance according to claim 18, wherein when the movable part is rotated to the fastening state, the elastic element provides an elastic force to clamp and hold the first body and the second body between the support part and the movable part, and when the movable part is rotated to the disassembling state, the force provided by the elastic element is reduced so that the movable part is rotated to the fastening state again.

20. The coating chucking appliance according to claim 19, wherein the movable part comprises a movable body and a movable arm, wherein the movable arm extends integrally along the movable body and has a movable distance from the second fixing part of the second body, and the movable body has a movable hole, wherein the support post passes through the movable hole and allows the movable arm to rotate between the fastening state and the disassembling state along the support post.

21. A coating method using the coating chucking appliance according to claim 1, comprising:
    forming a thick film layer on a first component on a surface of a substrate; and
    forming at least one thin film layer on a second component on the surface of the substrate, wherein a thickness of the thick film layer is greater than a thickness of the thin film layer.

22. The coating method according to claim 21, wherein the thickness of the thin film layer is not greater than 250 nm.

23. The coating method according to claim 21, further comprising: configuring a coating gap between at least one suspended shielding part of a coating chucking appliance and the second component of the substrate, wherein the substrate is installed to the coating chucking appliance to form the thick film layer and the thin film layer simultaneously.

24. The coating method according to claim 23, further comprising: configuring at least one non-coating area at a position shielded by the coating chucking appliance on the surface of the substrate.

25. The coating method according to claim 21, wherein the thin film layer comprises a first film layer, and the thick film layer comprises the first film layer and a second film layer.

26. The coating method according to claim 25, further comprising:
    forming the second film layer on a surface of the first component on the substrate by one coating process, wherein a surface of the second component on the substrate is shielded by the coating chucking appliance and cannot be coated; and
    forming the first film layer on a surface of the second film layer and on the surface of the second component on the substrate by another coating process simultaneously.

27. The coating method according to claim 25, further comprising:
    forming the first film layer on a surface of the first component and on a surface of the second component on the substrate by one coating process simultaneously; and
    forming the second film layer on the first film layer on the surface of the first component on the substrate by another coating process, wherein the surface of the second component on the substrate is shielded by the coating chucking appliance and cannot be coated.

28. The coating method according to claim 22, wherein forming a film layer on the surface of the substrate by a coating equipment comprises:
    installing the substrate to the coating chucking appliance and placing the substrate in a coating chamber of the coating equipment;
    generating a negative pressure in the coating chamber; and
    forming the film layer on the surface of the substrate by a chemical vapor deposition.

29. The coating method according to claim 28, wherein the coating chucking appliance has a plurality of installing chambers, and a plurality of substrates are installed in each of the plurality of installing chambers respectively.

30. The coating method according to claim 28, wherein the coating chucking appliance comprises a chucking body and at least one shielding component configured on the chucking body, the chucking body has at least one installing chamber for installing at least one substrate, and a position of the shielding component corresponds to a position to be shielded on the surface of the substrate, wherein after installation, the shielding component correspondingly shields the position to be shielded on the surface of the substrate.

31. The coating method according to claim 28, wherein the second component is a circuit interface component of an electronic device.

* * * * *